（12） United States Patent
Chao et al.

(10) Patent No.: US 6,791,130 B2
(45) Date of Patent: Sep. 14, 2004

(54) PHOTOCONDUCTOR-ON-ACTIVE-PIXEL (POAP) SENSOR UTILIZING A MULTI-LAYERED RADIATION ABSORBING STRUCTURE

(75) Inventors: Calvin Chao, Cupertino, CA (US);
Tzu-Chiang Hsieh, Fremont, CA (US);
Michael Engelmann, Kihei, HI (US);
Milam Pender, Kihei, HI (US)

(73) Assignee: E-Phocus, Inc., San Jose, CA (US)

( * ) Notice: Subject to any disclaimer, the term of this patent is extended or adjusted under 35 U.S.C. 154(b) by 59 days.

(21) Appl. No.: 10/229,954

(22) Filed: Aug. 27, 2002

(65) Prior Publication Data
US 2004/0041224 A1 Mar. 4, 2004

(51) Int. Cl.⁷ ............................ H01L 27/48; H01L 29/80
(52) U.S. Cl. ........................ 257/233; 257/258; 257/291; 257/292; 257/462
(58) Field of Search .................................. 257/222, 229, 257/233, 234, 257, 258, 291, 292, 462, 118, 290, 444, 461, 428

(56) References Cited

U.S. PATENT DOCUMENTS 6,018,187 A * 1/2000 Theil et al. ................. 257/458

* cited by examiner

Primary Examiner—Minhloan Tran
Assistant Examiner—Tan Tran
(74) Attorney, Agent, or Firm—Gary Eastman

(57) ABSTRACT

An active pixel sensor for producing images from electron-hole producing radiation includes a crystalline semiconductor substrate having an array of electrically conductive diffusion regions, an interlayer dielectric (ILD) layer formed over the crystalline semiconductor substrate and comprising an array of contact electrodes, and an interconnect structure formed over the ILD layer, wherein the interconnect structure includes at least one layer comprising an array of conductive vias. An array of patterned metal pads is formed over the interconnect structure and are electrically connected to an array of charge collecting pixel electrodes. A radiation absorbing structure includes a photoconductive N-I-B-P photodiode layer formed over the interconnect structure, and a surface electrode layer establishes an electrical field across the radiation absorbing structure and between the surface electrode layer and each of the array of charge collecting pixel electrodes. An array measurement circuit measures the charge collected and outputs pixel data defining an image.

23 Claims, 22 Drawing Sheets

PBIN Pixel Architecture

POAP Sensor Utilizing Multiple Circuitry Regions

POAP Sensor Utilizing Four-Sided Circuitry Region

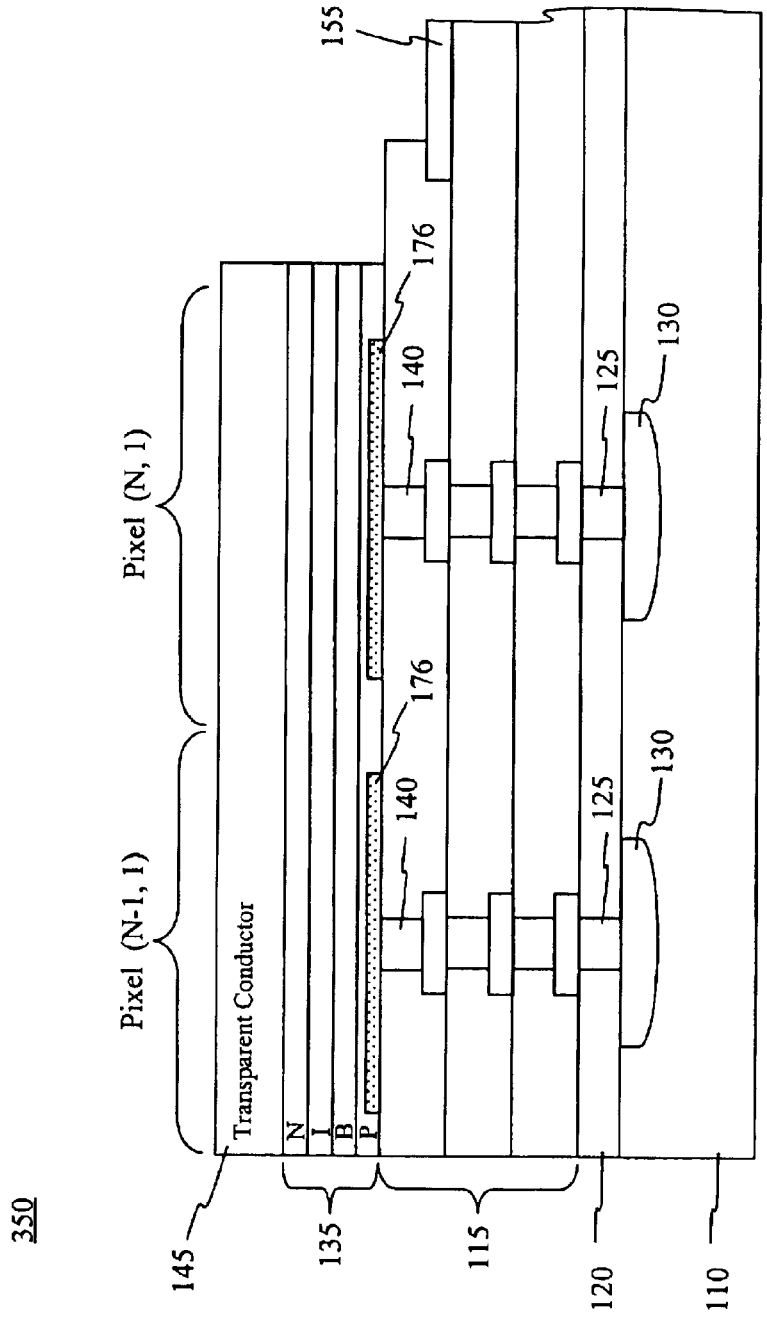

POAP Sensor Having A Discontinuous Trench

POAP Sensors Having Trench And Patterned Bottom Layers

Individual Pixel Cell Circuitry With GBT (PBIN Diode)

(NIBP Diode)

Individual Pixel Cell Circuitry Without GBT
FIG. 15
(PBIN Diode)
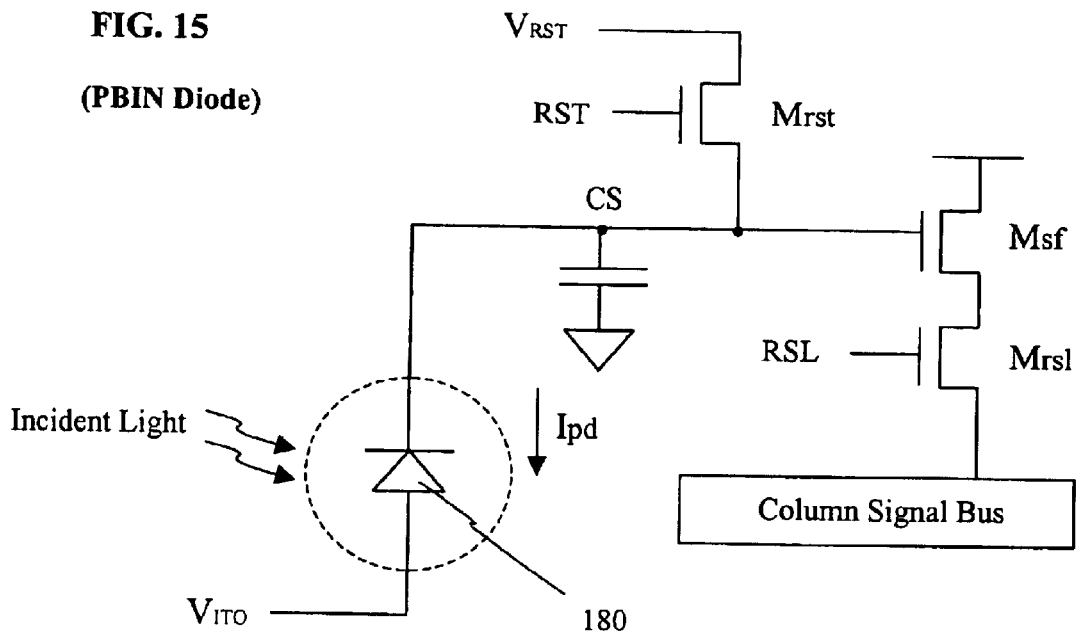
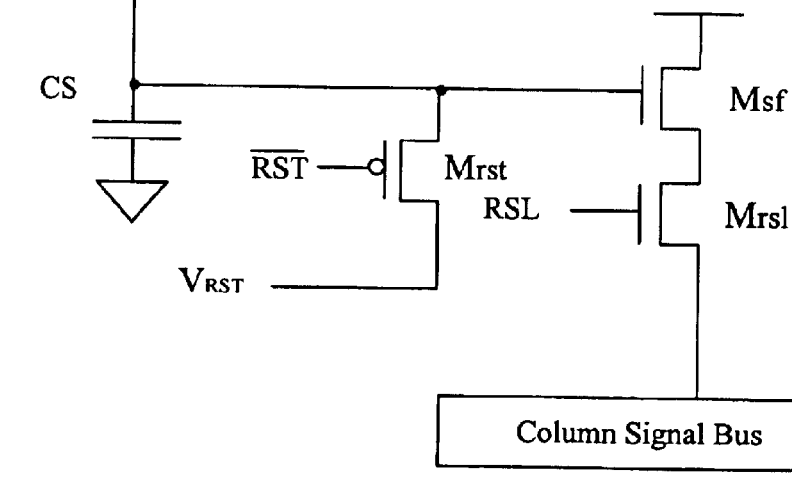
FIG. 16
(NIBP Diode)

Fabricating A POAP Sensor

POAP Sensor Fabrication

PHOTOCONDUCTOR-ON-ACTIVE-PIXEL (POAP) SENSOR UTILIZING A MULTI-LAYERED RADIATION ABSORBING STRUCTURE

FIELD OF THE INVENTION

The present invention relates to sensor arrays for sensing electromagnetic radiation, and in particular, to active pixel sensor arrays utilizing a multi-layered radiation absorbing structure.

BACKGROUND OF THE INVENTION

Image sensors and other light sensitive sensors may be fabricated to detect the intensity of light received by the sensor. These sensors typically generate electronic signals that have amplitudes that are proportional to the intensity of the light received by the sensor. The sensors can convert an optical image into a set of electronic signals. The electronic signals may represent, for example, intensities of light received by the sensor. The electronic signals can also be conditioned and sampled to allow image processing.

One of the currently available types of image sensors is commonly referred to as an active pixel sensor. Active pixel sensors are typically fabricated using standard complementary metal-oxide semiconductor (CMOS) processes enabling these sensors to be integrated with digital and analog signal processing circuitry.

In conventional active pixel sensors, each pixel cell typically comprises photosensitive and non-photosensitive devices. The types of photosensitive devices include photodiodes, photoconductors, photogate MOS capacitors, and other similar devices. Non-photosensitive devices that may be found in many active pixel sensors include one or more transistors.

In many active pixel sensors, the photosensitive devices compete with non-photosensitive devices for available space on the sensor. Advances in CMOS processes permit the fabrication of sensors having pixel cells with increasing smaller geometries. As a result, the junction depth of the PN junctions and the depletion width of the MOS capacitors shrink proportionally. However, many CMOS fabricated sensors contain junction depths that are so shallow that they become much smaller than the absorption length of visible light in silicon substrate. As such, conventional active pixel sensors may suffer from deteriorating photosensitivity that may be proportional to the shrinking of the baseline CMOS process.

A variety of existing active pixel sensors are fabricated by layering a translucent conductive layer over a PIN or NIP photodiode, which is formed over a substrate. Typically, the bottom layer of the PIN or NIP photodiodes is connected to a pixel electrode that is associated with an individual pixel in the pixel cell array.

In some sensors, a voltage is applied to the top transparent conductive layer to reverse-bias the PIN (or NIP) photodiode. In conventional three-transistor pixel cells, for example, the charge collecting pixel electrode is electrically shorted with the charge-sensing node of the pixel cell. Thus, during the charge integration process, the electrical potential of the pixel electrode may vary from pixel to pixel, depending on the amount of charge collected at each pixel site. In many sensors, each of an array pixel cells may have pixel electrodes that are electrically connected because they all share a common bottom layer of the PIN or NIP diode.

A problem that typically occurs when neighboring pixel electrodes are not electrically isolated from one another is commonly referred to as pixel crosstalk. Pixel crosstalk may occur in conventional active pixel sensors when current flows from higher-potential electrodes to neighboring, lower-potential, electrodes. The presence of pixel crosstalk is often undesirable because it may result in the capturing of a blurred image.

While there have been some attempts to design sensors that alleviate or minimize undesirable affects, such as pixel crosstalk, these attempts have not been entirely successful. Accordingly, a present need exists for an active pixel sensor that can provide, for example, increasingly sharper images by minimizing undesirable affects such as pixel crosstalk.

SUMMARY OF THE INVENTION

The present invention includes an active pixel sensor for producing images from electron-hole producing radiation. The sensor includes a crystalline semiconductor substrate having an array of electrically conductive diffusion regions, an interlayer dielectric (ILD) layer formed over the crystalline semiconductor substrate and comprising an array of contact electrodes, and an interconnect structure formed over the ILD layer, wherein the interconnect structure includes at least one layer comprising an array of conductive vias. To facilitate the collection of charge from each pixel, an array of patterned metal pads is formed over the interconnect structure and are electrically connected to an array of charge collecting pixel electrodes defined by the array of diffusion regions, contact electrodes, array of conductive vias, and patterned metal pads.

A radiation absorbing structure includes a N-I-B-P photodiode layers formed over the interconnect structure and array of patterned metal pads. This N-I-B-P photodiode layer is photoconductive on exposure to electron-hole producing radiation. A surface electrode layer having an electrically conductive material is formed over the radiation absorbing layer to provide a source for electrons. This surface electrode layer is at least partially transparent to the electron-hole producing radiation, and connected to a voltage source for establishing an electrical field across the radiation absorbing structure and between the surface electrode layer and each of the array of charge collecting pixel electrodes.

In a preferred embodiment, the present invention also includes an array measurement circuit for measuring charges collected by each of electrodes in the array of charge collecting pixel electrodes. This circuit also facilitates the outputting of pixel data indicative of the collected charges, thereby providing pixel data that comprises information to defining an image.

BRIEF DESCRIPTION OF THE DRAWINGS

The nature, objects, and advantages of the present invention will become more apparent to those skilled in the art after considering the following detailed description in connection with the accompanying drawings, in which like reference numerals designate like parts throughout, and wherein:

FIG. 5B is a cross-sectional diagram illustrating an alternative embodiment of a NIBP sensor utilizing a metal pad;

FIG. 15 is a schematic diagram of exemplary circuitry that may be used for an individual pixel cell having a PBIN diode structure, without the use of a gate bias transistor;

FIG. 16 is a schematic diagram of exemplary circuitry that may be used for an individual pixel cell having a NIBP diode structure, without the use of a gate bias transistor;

DETAILED DESCRIPTION OF A PREFERRED EMBODIMENT

In the following description of a preferred embodiment, reference is made to the accompanying drawings, which form a part hereof, and which show by way of illustration a specific embodiment of the invention. It is to be understood by those of working skill in this technological field that other embodiments may be utilized, and structural, electrical, as well as procedural changes may be made without departing from the scope of the present invention.

The term "substrate" is to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to "substrate" in the following description, previous process steps may have been utilized to form regions or junctions in the base semiconductor structure or foundation, other than the pixel cell circuitry that will be described in detail herein. In addition, the semiconductor need not be silicon-based, but could be based on silicon-germanium (SiGe), germanium (Ge), gallium arsenide (GaAs), or other similar materials.

The substrate may also contain one or more circuitry regions (not shown) providing, for example, readout and control circuitry that may be necessary to support the associated pixel cell arrays. Additionally, these circuitry regions may also be fabricated to include, for example, analog-to-digital converters (ADC), digital signal processors (DSP), timing and control circuitry, as well as circuits providing image processing support. Additionally, RF circuitry may be included to accommodate the transmission and receiving requirements to support the active pixel sensor for use in a wireless imager, for example.

The term "light" is to be understood as including electromagnetic radiation comprising visible as well as invisible light.

PBIN POAP Sensor

Figure 1:
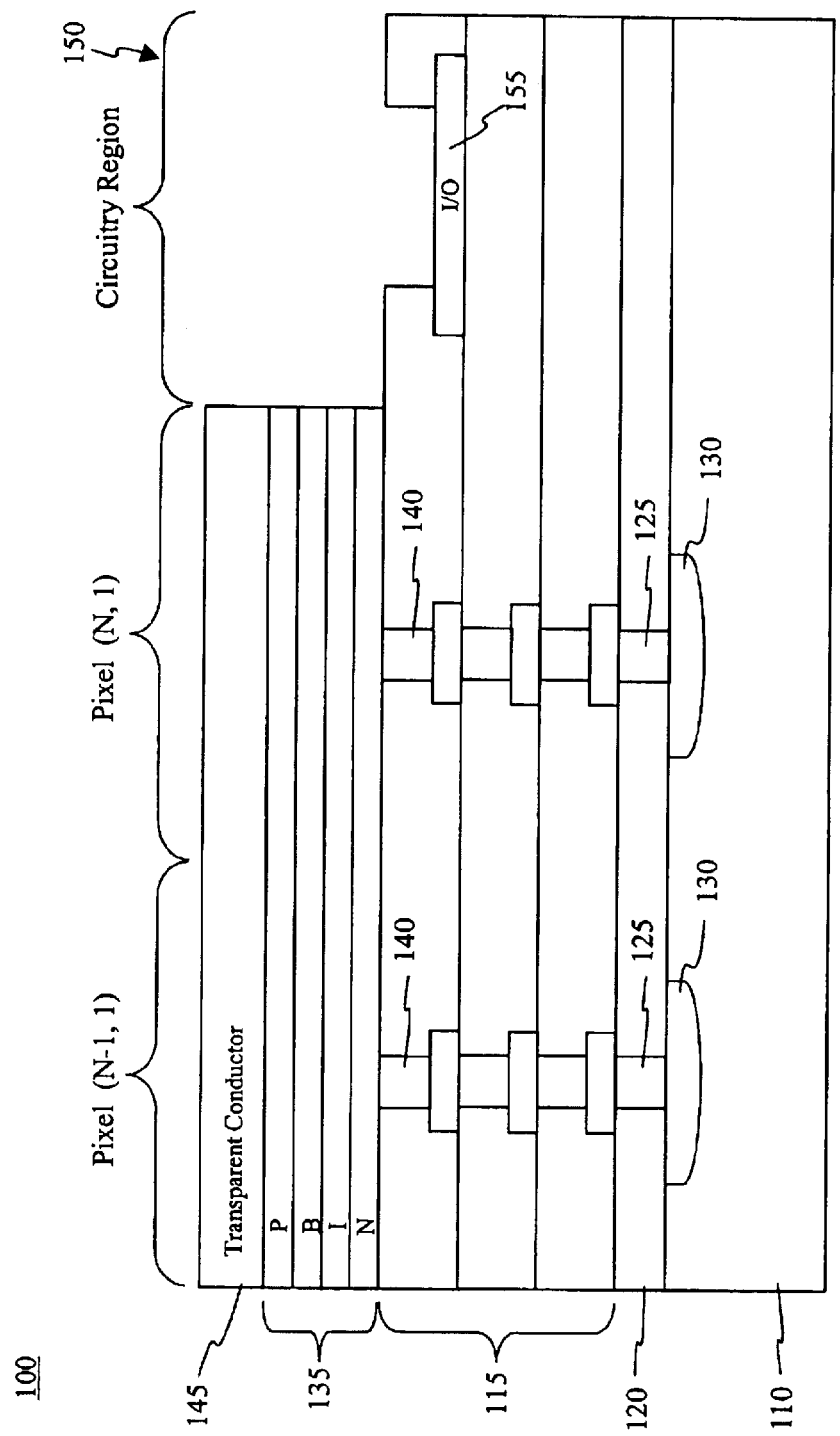
FIG. 1 is a cross-sectional diagram illustrating a first embodiment of a PBIN sensor of the present invention.

Referring now to FIG. 1, a cross-sectional view of a sensor according to a first embodiment of the present invention is shown and generally designated 100. As shown, sensor 100 includes a substrate 110 and an interlayer dielectric (ILD) layer 120 formed over the substrate 110. Sensor 100 may further include a multi-tiered interconnection structure 115 formed over the ILD layer 120. A radiation absorbing layer 135 and transparent conductor layer 145 are shown formed over the ILD layer 120.

Each of an array of pixel sensors may also include a contact 125 to provide an interconnection between the multi-tiered interconnection structure 115 and a diffusion region 130 that is shown formed in substrate 110. As will be described in detail herein, substrate 110 may further include pixel cell circuitry that may, or may not, be used to assist in the reduction or elimination of pixel crosstalk.

A radiation absorbing structure 135 is shown formed adjacent to an upper surface of the multi-tiered interconnect structure 115. In one embodiment, the radiation absorbing structure 135 may include an N-layer formed adjacent to an upper surface of the multi-tiered interconnect structure 115; an I-layer formed adjacent to the N-layer; a B-layer formed adjacent to the I-layer; and a P-layer formed adjacent to the B-layer. The P-layer, B-layer, I-layer, and the N-layer collectively form a PBIN photodiode layer structure, which will also be referred to herein as a radiation absorbing structure 135.

Each of an array of pixel sensors may utilize an associated conductive via 140 to electrically connect the radiation absorbing structure 135 to the substrate 110. A transparent conductor layer 145 is shown formed adjacent to a top layer of the radiation absorbing structure 135.

Sensor 100 is also shown having a circuitry region 150 occupying a portion of the sensor. The circuitry region 150 may include an input/output pad 155 that contains circuitry to support the operation of the sensor 100. Various circuitry region configurations are shown and described with respect to FIGS. 4A–4C.

For clarity, the present invention will first be described with respect to a PBIN photodiode layer configuration. However, the present invention fully contemplates a NIBP design, which will be described in detail with respect to later figures.

Referring still to FIG. 1, conductive vias 140 are shown passing through the multi-tiered interconnection structure 115 and electrically connecting the radiation absorbing structure 135 to the diffusion region 130.

The conductive vias 140 may be formed from an appropriate electrically conductive material, such as tungsten, copper, aluminum, or other similar materials. However, tungsten is often utilized because this material has been shown to be particularly useful in forming narrow and relatively long interconnections. Typically, the conductive vias 135 are formed using a chemical vapor deposition (CVD) process, but other processes may be used.

Typically, the PBIN layers of the radiation absorbing structure 135 are fabricated with photosensitive materials, such as amorphous-silicon, and typically comprise silicon, carbon, and hydrogen atoms in each of the layers.

In particular, the P-layer typically includes p-type atoms or molecules, such as boron or atoms in group III of the Period table, that are doped into the P-layer. In one embodiment of the present invention, the P-layer may comprise a C to Si ratio that is greater than one, but other ratios may be used.

The B-layer may also be doped with p-type atoms, but such doping is not essential. Similarly to the P-layer, the B-layer may include a C to Si ratio that is greater than one. However, sensor performance may be modified or enhanced by fabricating the P and B-layers so that that they have different relative C to Si ratios.

The I-layer of the radiation absorbing structure 135 represents an intrinsic layer that may include silicon, carbon, and hydrogen atoms, with no other atoms intentionally, or unintentionally, doped into this layer.

The N-layer represents an amorphous silicon layer where n-types atoms or molecules, such as phosphor or atoms in group V of Period table, are doped into the N-layer.

Notably, a bottom N-layer of the PBIN photodiode layer structure of sensor 100 is in electrical communication with the diffusion region 130. Thus, according to one embodiment, the introducing a species, such as carbon, into the contacting bottom layer of the NIBP photodiode layered structure (e.g., the N-layer) may increase resistivity of this layer to such a degree that pixel crosstalk between adjacent pixel cells may be substantially reduced, or even eliminated.

The doping of various layers of the sensor of the present invention may be achieved by known semiconductor manufacturing processes. These processes may be used to create a layer having a doping gradient, e.g., a doping concentration that varies as a function of depth of the layer, or an abrupt change in the doping concentration. The doping gradient, or profile, may be optimized for a particular sensor design.

Although several specific examples of appropriate materials that may used to fabricate the radiation absorbing structure 135 have been described, the present invention is not so limited. Accordingly, one of ordinary skill will realize that the PBIN layers of the radiation absorbing structure 135 may also be formed from amorphous carbon, amorphous silicon carbide, amorphous germanium, amorphous silicon-germanium, or other similar materials.

The transparent conductor layer 145 may be formed from an indium tin oxide (ITO), tin oxide, titanium nitride, thin silicide, or other similar materials. A protective layer (not shown) may also be formed over the transparent conductor 145. The protective layer may provide mechanical protection, electrical insulation, as well as providing anti-reflective characteristics. Although a protective layer may be useful, it is not essential to the invention.

Each of the sensor embodiments described herein may be configured with any of a variety of different pixel cell circuitry configurations that may, or may not, be used to assist in the reduction or elimination of pixel crosstalk. Several non-limiting examples of appropriate pixel cell circuitry designs will be described in detail herein.

PBIN Pixel Architecture

Figure 2:
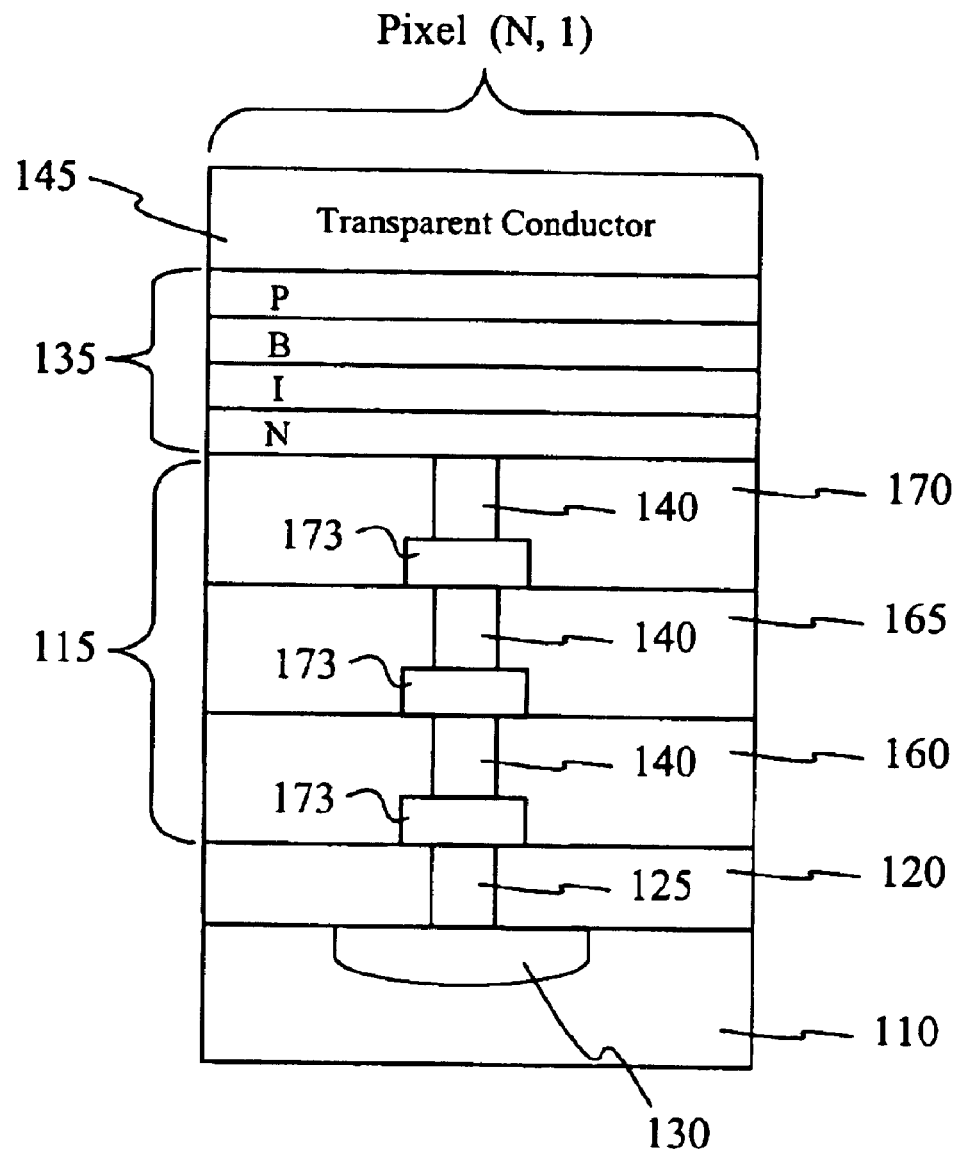
FIG. 2 is a partial cross-sectional diagram illustrating exemplary pixel cell architecture that may be used in any of the POAP sensor embodiments of the present invention.

FIG. 2 shows a more detailed view of pixel cell architecture that may be used by any of the sensor embodiments of the present invention. In particular, FIG. 2 shows an individual pixel cell having a transparent conductor layer 145 formed adjacent to the radiation absorbing structure 135, which in turn is formed adjacent to an upper surface of the multi-tiered interconnect structure 115.

The multi-tiered interconnect structure 115 is shown having three distinct layers, 160, 165, and 170. Each of the three layers of the interconnect structure 115 may include dielectric material (e.g., silicon oxide, silicon nitride, or other similar materials) to form separate inter metal dielectric (IMD) layers.

Each of the three IMD layers may further include a via 140 and metal region 173. The vias 140 are typically utilized to provide an electrical connection between the radiation absorbing structure 135 (e.g., the N-layer in a PBIN configuration, or a P-layer in a NIBP layered design) and the diffusion region 130. The multi-tiered interconnection structure 115 is typically utilized whenever structural support, for example, is desired.

An interlayer dielectric (ILD) layer 120 may be formed adjacent to the bottom portion of the multi-tiered interconnection structure 115, and a top portion of the substrate 110 and diffusion region 130. Similarly to the IMD layers, the ILD layer 120 may be fabricated with an appropriate insulation material, such as silicon oxide, silicon nitride, and the like. A contact 125 may also be formed in the ILD layer 120 and placed in electrical communication with the diffusion region 130. Contact 125 may be formed from an appropriate conductive material. According to one embodiment, an array of diffusion regions 130, an array of contact electrodes 125, and an array of conductive vias 140 define an array of charge collecting pixel electrodes.

The present invention will be described with specific reference made to multiple interconnection layers (e.g., IMD layers, ILD layers). However, one of ordinary skill will realize that the number of interconnection layers and structures utilized is not essential and additional or fewer structural layers may be used to accommodate a particular sensor design. Furthermore, the structure and methods of forming these interconnection layers and structures are well known in the field of electronic integrated circuit fabrication, and therefore will not be further described.

PBIN Pixel Cell Having a Metal Pad

Figure 3A:
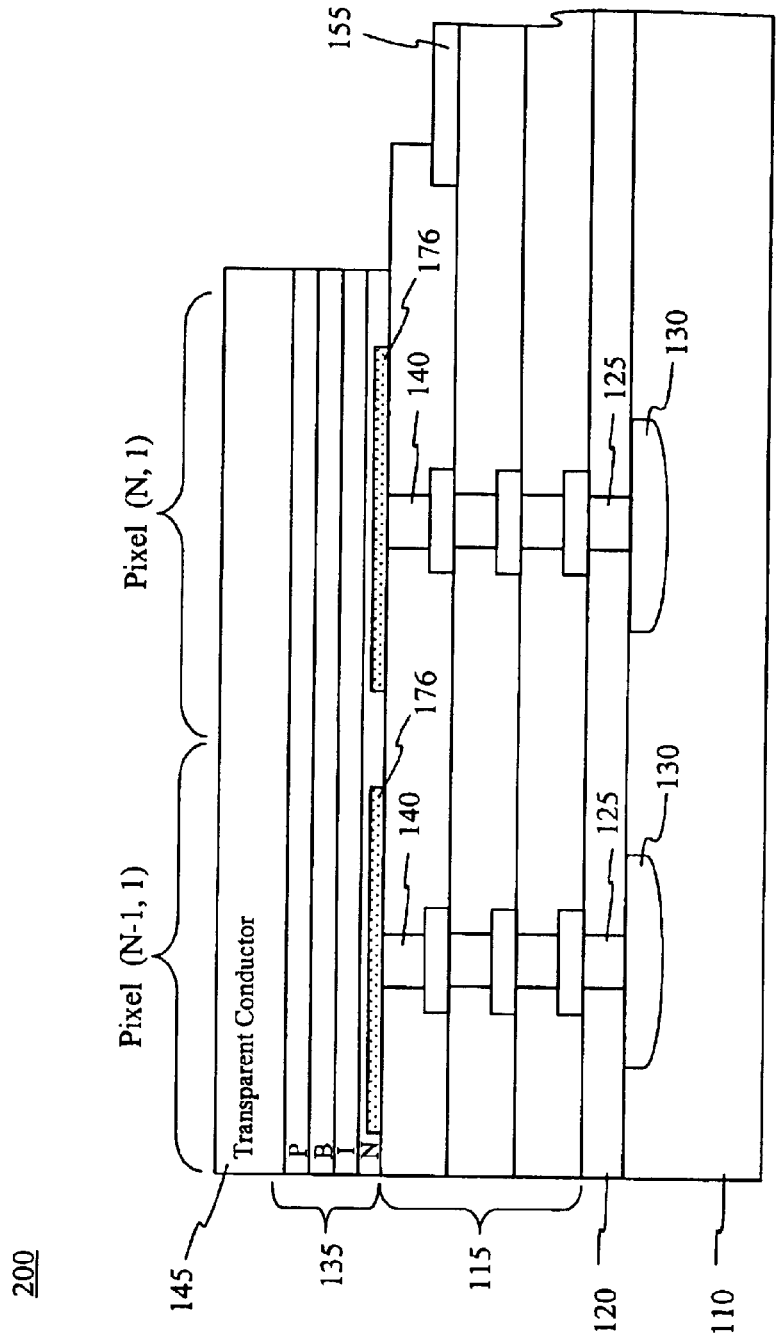
FIG. 3A is a cross-sectional diagram illustrating a PBIN sensor utilizing a metal pad.

FIG. 3A is a cross-sectional diagram of a sensor utilizing alternative pixel cell architecture, and is generally designated 200. Similarly to the sensor and pixel cell architecture shown in FIG. 2, the sensor 200 comprises a transparent conductor layer 145 formed adjacent to the radiation absorbing structure 135, which is formed adjacent to an interconnect structure 115 and interlayer dielectric (ILD) layer 120.

In contrast to the FIG. 2 sensor, the sensor 200 comprises metal pads 176 that are in electrical communication with vias 140. The metal pads 176 may be used in conjunction with the vias 140 to provide an electrical connection between the radiation absorbing structure 135 (e.g., the bottom N-layer in a PBIN configuration, or a bottom P-layer in a NIBP layered design) and the diffusion region 130.

The metal pads 176 may be formed from an appropriate conductive material. Typically, the metal pads 176 are formed so that they do not disrupt a continuous bottom N-layer (or the P-layer in a NIBP configuration). It further desirable for the metal pads 176 to be formed so that they are substantially contained within their respective pixel cells, thereby preventing contact between metal pads of adjacent pixel cells.

According to one embodiment of the present invention, an array of diffusion regions 130, an array of contact electrodes 125, an array of conductive vias 140, and an array of metal pads 176 define an array of charge collecting pixel electrodes.

PBIN Pixel Cell Having a metal pad (alt. Design)

Figure 3B:
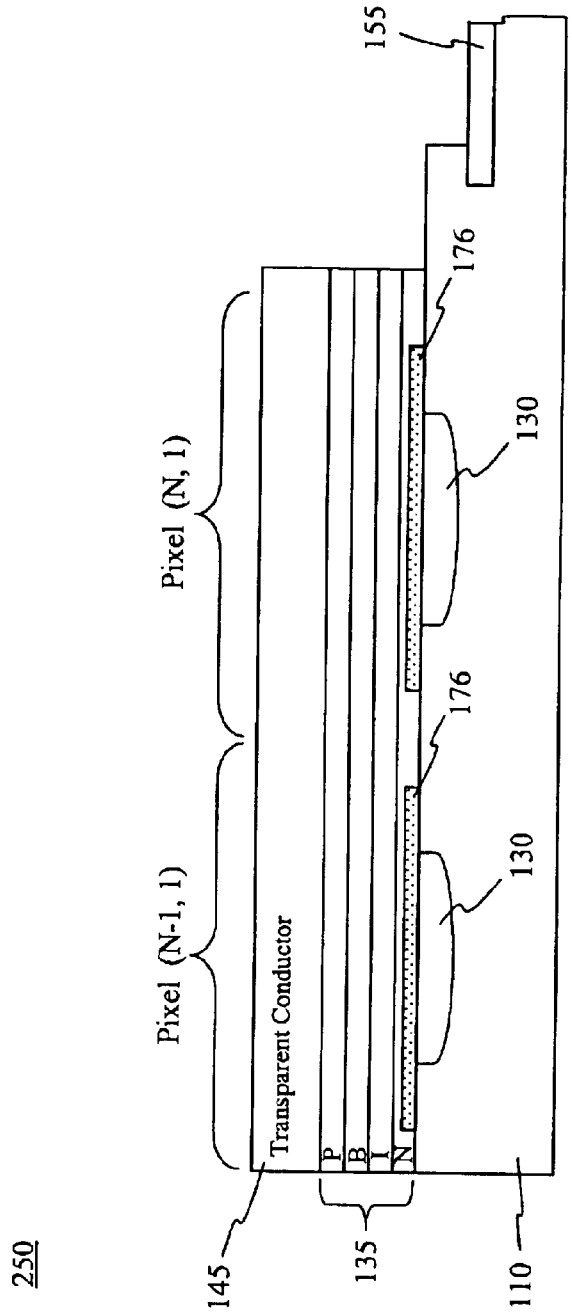
FIG. 3B is a cross-sectional diagram illustrating an alternative embodiment of a PBIN sensor.

FIG. 3B is a cross-sectional diagram of a sensor utilizing alternative pixel cell architecture, and is generally designated 250. Similarly to the sensor and pixel cell architecture shown in FIG. 3A, the sensor 250 comprises a transparent conductor layer 145 formed adjacent to the radiation absorbing structure 135.

Sensor 250 also comprises metal pads 176 that provide electrical communication between the radiation absorbing structure 135 (e.g., the N-layer in a PBIN configuration, or a P-layer in a NIBP layered design) and the diffusion region 130. However, the sensor 250 does not utilize an interconnection structure 115 or an interlayer dielectric (ILD) layer 120, which are incorporated in many of the other sensor designs of the present invention. In the illustrated PBIN configuration, an array of charge collecting pixel electrodes may be defined by an array of diffusion regions 130 and an array of metal pads 176.

Various Circuitry Region Configurations

Figure 4A:
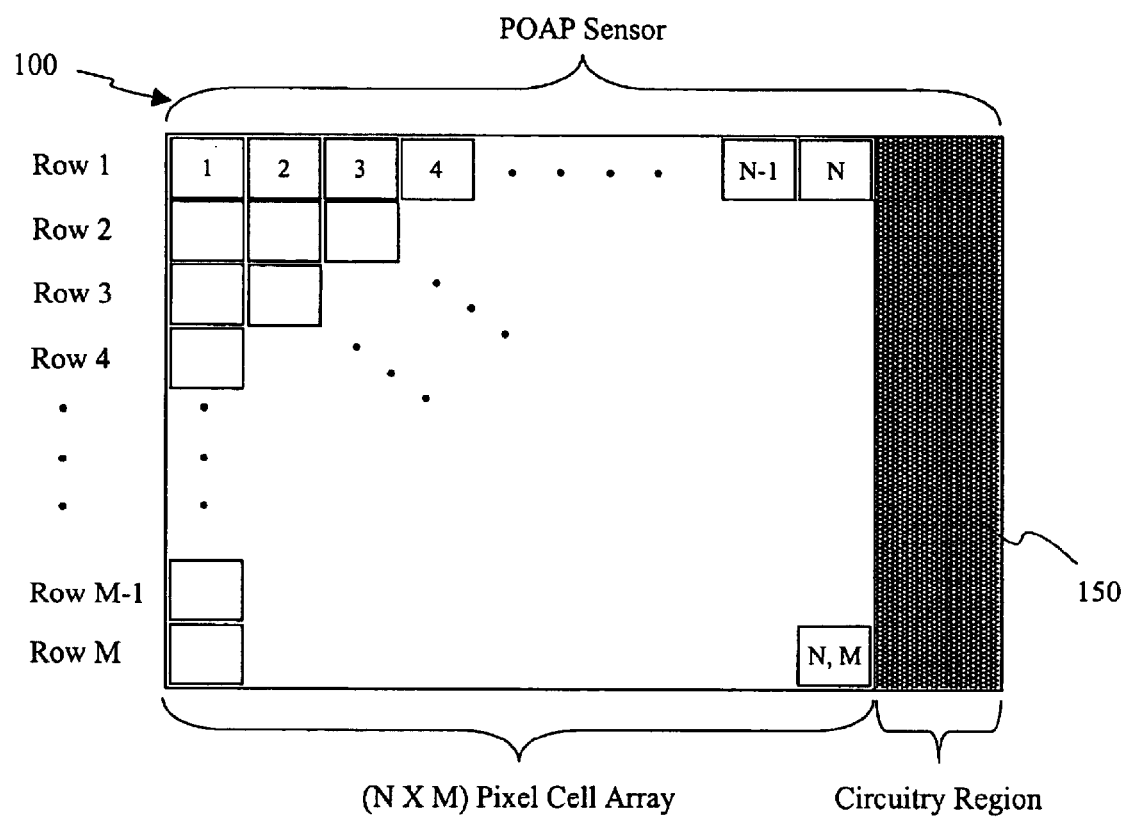
FIG. 4A is a top-view of the POAP sensor of the present invention showing the relative relationship between the pixel cell array and an isolated sensor circuitry region according to one embodiment.

FIG. 4A shows the relative relationship, according to one embodiment of the present invention, of the pixel cell array and the circuitry region 150. In this Figure, the sensor 100 is shown having an (N×M) pixel cell array of individual pixels. Notably, the circuitry region 150 is isolated to the extent that the region occupies a single side of the sensor 100.

The circuitry region 150 may include readout and control circuitry that may be necessary to support the associated pixel cell array of the sensor 100. Circuitry region 150 may also be fabricated to include, for example, analog-to-digital converters (ADC), digital signal processors (DSP), timing and control circuitry, as well as circuits providing image processing support. Circuitry region 150 may further include RF circuitry to accommodate the image data transmission and receiving requirements for use in a wireless imager, for example.

The POAP sensor of the present invention may include a pixel cell array having a wide range of individual pixel cells. For example, the rows and columns of the (N×M) pixel cell array may each be expanded or reduced to achieve a desired array size and configuration (e.g., 120×160, 256×256, 512× 512, 1024×1024, 2048×2048, 4096×4096, etc.) However, it is to be understood that the present invention is not limited to a particular array size or geometry, and most any array configuration, up to and including the available maximum pixel density capabilities of the CMOS fabrication process may be used. The present invention further contemplates the modification of the size of individual pixel cells, as well as the modification of the size and geometries of the pixel cells arrays, to accommodate any lens cost limitations that may exist.

Figure 4B:
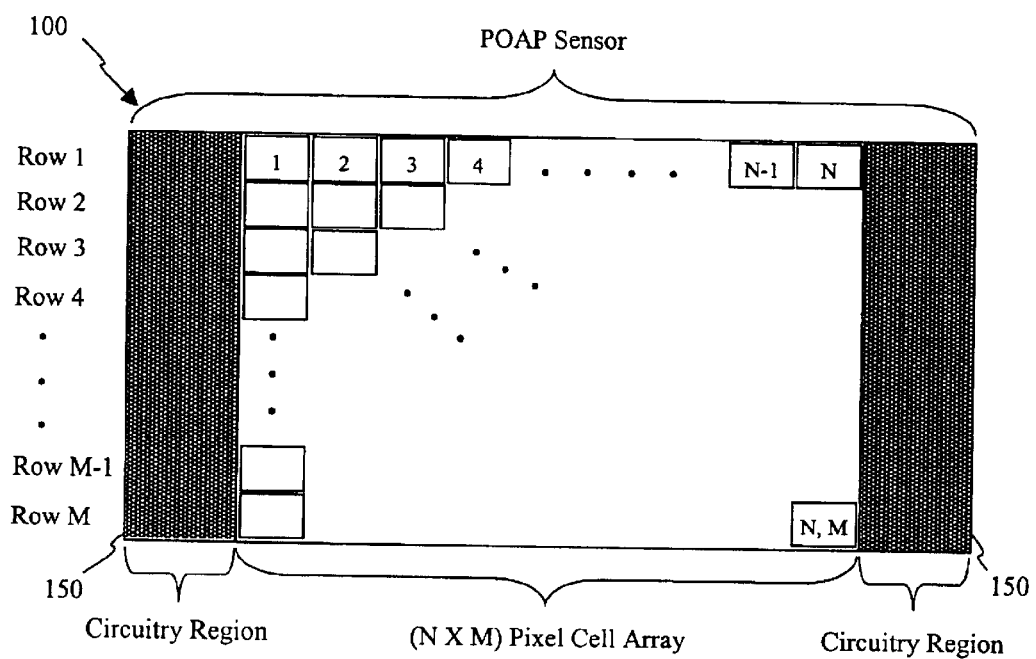
FIG. 4B is a top-view of the POAP sensor of the present invention showing the relative relationship between the pixel cell array and multiple sensor circuitry regions according to another embodiment.
Figure 4C:
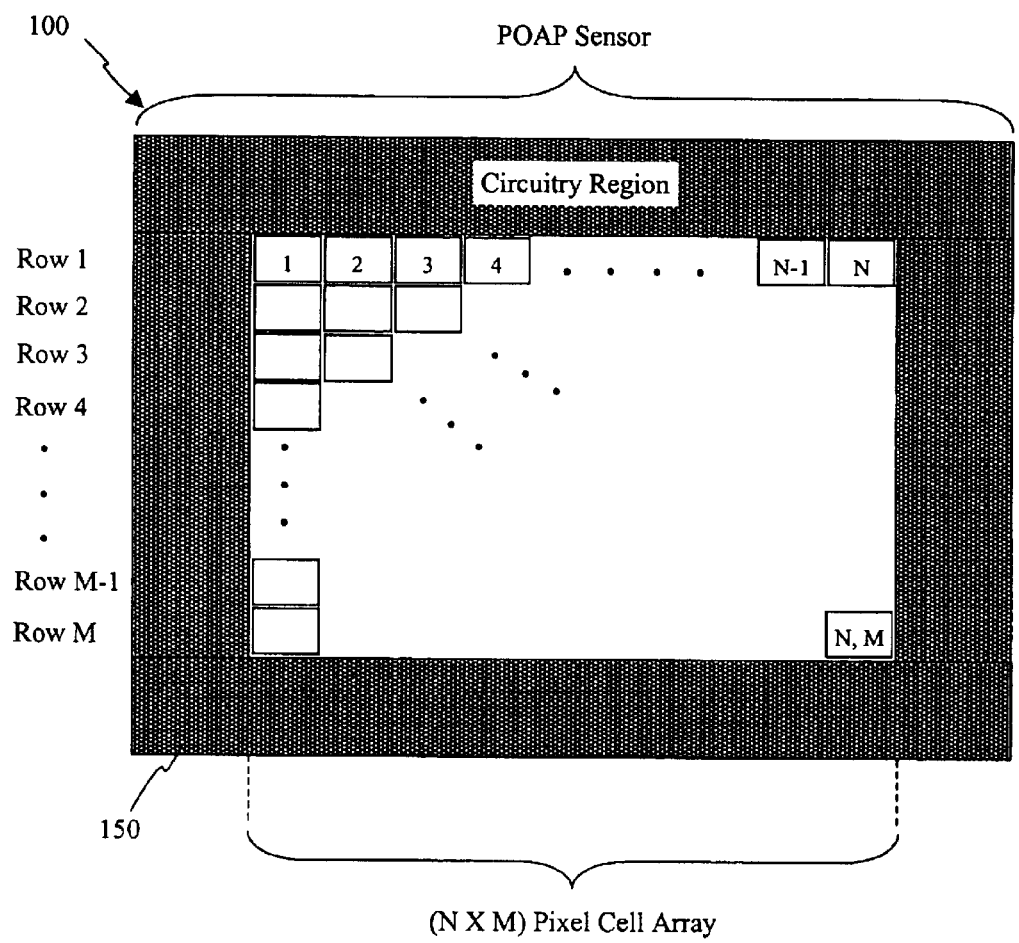
FIG. 4C is a top-view of the POAP sensor of the present invention showing the relative relationship between the pixel cell array and a four-sided sensor circuitry region according to another embodiment.

FIGS. 4B–C show additional configurations that may be utilized in the POAP sensor of the present invention. FIG. 4B shows sensor 100 having an (N×M) pixel cell array disposed between two circuitry regions 150, while FIG. 4C shows sensor 100 having an (N×M) pixel cell array that is fabricated in such a manner that a circuitry region 150 surrounds the entire pixel cell array.

The arrangement of the pixel cell array and circuitry regions shown in FIGS. 4A–C provide sensors that may be used in a variety of different applications. For example, sensor modules may be fabricated by scaling a plurality of individual sensors that utilize one or more of the sensor configurations shown in these Figures. It is to be understood that the circuitry region configurations shown in FIGS. 4A–C may be utilized by any of the sensor designs described herein.

NIBP POAP Sensor

Figure 5A:
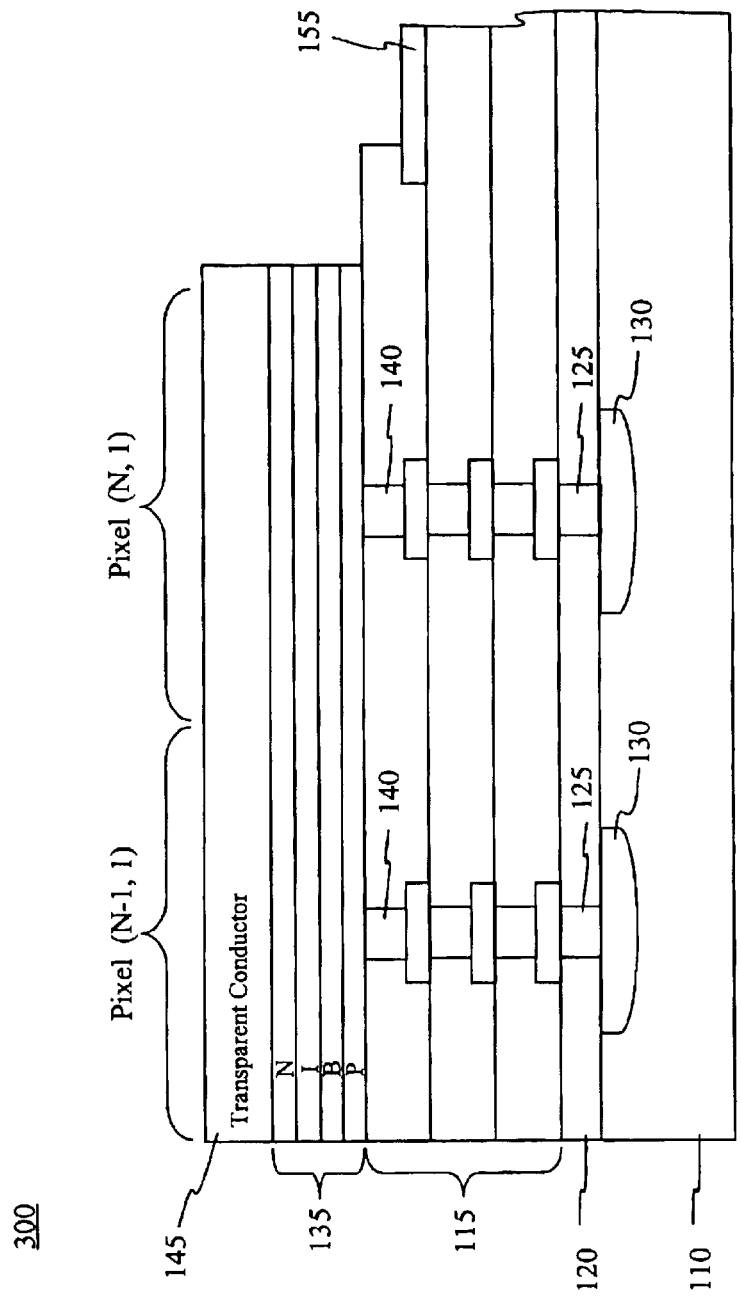
FIG. 5A is a cross-sectional diagram illustrating one embodiment of a NIBP sensor according to the present invention.

FIG. 5A is a cross-sectional view of a sensor according to an alternative embodiment of the present invention, and is generally designated 300. Sensor 300 includes architecture that is similar in many respects to that which may be utilized in, for example, sensor 100 (FIG. 1). In particular, sensor 300 may include an interlayer dielectric (ILD) layer 120 formed over the substrate 110, and a multi-tiered interconnection structure 115 formed over the ILD layer 120. A radiation absorbing layer 135 and transparent conductor layer 145 are shown formed over the ILD layer 120.

Similarly to the other sensor designs, sensor 300 may be formed with an array of contacts 125 to provide an interconnection between the multi-tiered interconnection structure 115 and the diffusion region 130. Sensor 300 may also be configured with any of a variety of different pixel cell circuitry configurations that may, or may not, be used to assist in the reduction or elimination of pixel crosstalk. Several non-limiting examples of appropriate pixel cell circuitry designs will be described in herein.

Sensor 300 also comprises a radiation absorbing structure 135 that is shown formed adjacent to an upper surface of the multi-tiered interconnect structure 115. In one embodiment, the radiation absorbing structure 135 may include an P-layer formed adjacent to an upper surface of the multi-tiered interconnect structure 115; a B-layer formed adjacent to the P-layer; an I-layer formed adjacent to the B-layer; and an N-layer formed adjacent to the I-layer. The N-layer, I-layer, B-layer, and the P-layer collectively form a NIBP photodiode layer structure, which will also be referred to herein as a radiation absorbing structure 135.

Each of an array of pixel sensors may utilize an associated conductive via 140 to electrically connect the radiation absorbing structure 135 to the substrate 110. A transparent conductor layer 145 is shown formed adjacent to a top layer of the radiation absorbing structure 135.

Referring still to FIG. 5A, conductive vias 140 are shown passing through the multi-tiered interconnection structure 115 and electrically connecting the radiation absorbing structure 135 to the diffusion region 130. Notably, a bottom P-layer of the NIBP photodiode layer structure of sensor 300 is in electrical communication with the diffusion region 130.

Similarly to the sensor 100 design, the sensor 300 may comprise NIBP layers that are fabricated with photosensitive materials, such as amorphous-silicon, and typically comprise silicon, carbon, and hydrogen atoms in each of the layers.

In particular, the P-layer typically includes p-type atoms or molecules, such as boron or atoms in group III of the Period table, that are doped into the P-layer. In one embodiment, the P-layer may comprise a C to Si ratio that is greater than one, but other ratios may be used.

The B-layer may also be doped with p-type atoms, but such doping is not essential. Similarly to the P-layer, the B-layer may include a C to Si ratio that is greater than one. However, sensor performance may be modified or enhanced by fabricating the P and B-layers so that that they have different relative C to Si ratios. For example, introducing a species, such as carbon, into the contacting bottom layer of the NIBP photodiode layered structure (e.g., the P-layer) increases resistivity of this layer to such a degree that pixel crosstalk between adjacent pixel cells may be substantially reduced, or even eliminated.

The I-layer of the radiation absorbing structure 135 represents an intrinsic layer that may include silicon, carbon, and hydrogen atoms, with no other atoms intentionally, or unintentionally, doped into this layer.

The N-layer represents an amorphous silicon layer where n-types atoms or molecules, such as phosphor or atoms in group V of Period table, are doped into the N-layer.

Similarly to the other sensor designs, the NIBP layer configuration of sensor 300 may also be formed from amorphous carbon, amorphous silicon carbide, amorphous germanium, amorphous silicon-germanium, or other similar materials. An optional protective layer (not shown) may also be formed over the transparent conductor 145, if desired. In the illustrated NIBP configuration, an array of charge collecting pixel electrodes may be defined by an array of diffusion regions 130, an array of contact electrodes 125, and an array of conductive vias 140.

NIBP Pixel Cell Having a Metal Pad

FIG. 5B is a cross-sectional diagram of a sensor utilizing alternative pixel cell architecture, and is generally designated 350. Sensor 350 is similar in many respects to the sensor and pixel cell architecture shown in FIG. 5A. For example, sensor 350 comprises a transparent conductor layer 145 formed adjacent to the radiation absorbing structure 135, which is formed adjacent to an interconnect structure 115 and interlayer dielectric (ILD) layer 120.

However, in contrast to the FIG. 5A sensor, sensor 350 comprises metal pads 176 that are in electrical communication with vias 140. The metal pads 176 may be used in conjunction with the vias 140 to provide an electrical connection between the radiation absorbing structure 135 (e.g., the P-layer in a NIBP configuration, or a N-layer in a PBIN layered design) and the diffusion region 130.

Again, the metal pads 176 are typically formed so that they do not disrupt the continuous bottom P-layer, while being substantially contained with their respective pixel cell to prevent contact between metal pads of adjacent pixel cells. In the illustrated NIBP configuration, an array of charge collecting pixel electrodes may be defined by an array of diffusion regions 130, an array of contact electrodes 125, an array of conductive vias 140, and an array of metal pads 176.

NIBP Pixel Cell Having a metal pad (alt. Design)

Figure 5C:
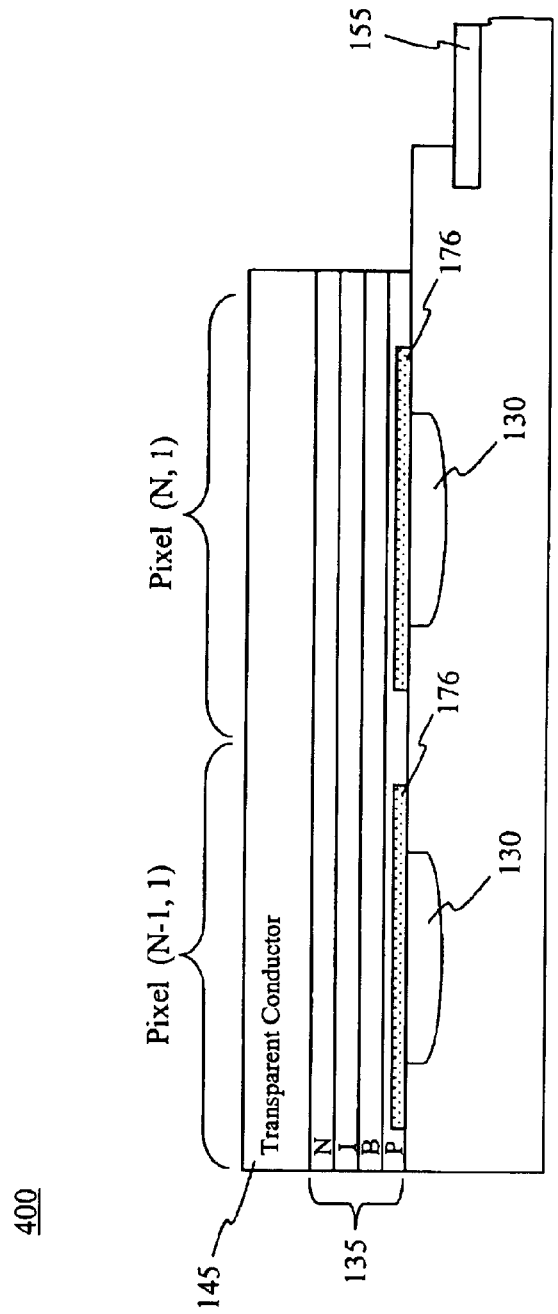
FIG. 5C is a cross-sectional diagram illustrating another alternative embodiment of a NIBP sensor.

FIG. 5C is a cross-sectional diagram of a sensor utilizing another alternative pixel cell architecture, and is generally designated 400. Similarly to the sensor and pixel cell architecture shown in FIG. 5B, the sensor 400 comprises a transparent conductor layer 145 formed adjacent to the radiation absorbing structure 135.

Sensor 400 also comprises metal pads 176 that provide electrical communication between the radiation absorbing structure 135 (e.g., the bottom P-layer in a NIBP layered design) and the diffusion region 130. Notably, the sensor 400 does not utilize an interconnection structure or an interlayer dielectric (ILD) layer, which is incorporated into many of the other sensor designs.

Accordingly, a NIBP configuration is shown where an array of charge collecting pixel electrodes may be defined by an array of diffusion regions 130 and an array of metal pads 176.

POAP Sensor Utilizing Discontinuous Photoconductor Layer

A variety of different sensor designs utilizing a continuous radiation absorbing structures 135 have been described, such that the PBIN (and NIBP) photodiode layers are continuous or substantially continuous. However, the present invention is not so limited and fully envisions designs where one or more layers of the radiation absorbing structure 135 are fractured, patterned, disjointed, non-planar, or otherwise disrupted.

By way of example only, alternative embodiments of the present invention utilizing discontinuous, trenched, and patterned PBIN photodiode layer configurations will now be described. Although these alternative designs will be described with respect to a particular PBIN sensor design, it is to be understood that any of the PBIN and NIBP photodiode layer sensor designs (e.g., sensors 100, 200, 250, 300, 350, 400, etc.) described herein may incorporate these alternative configurations.

Figure 6:
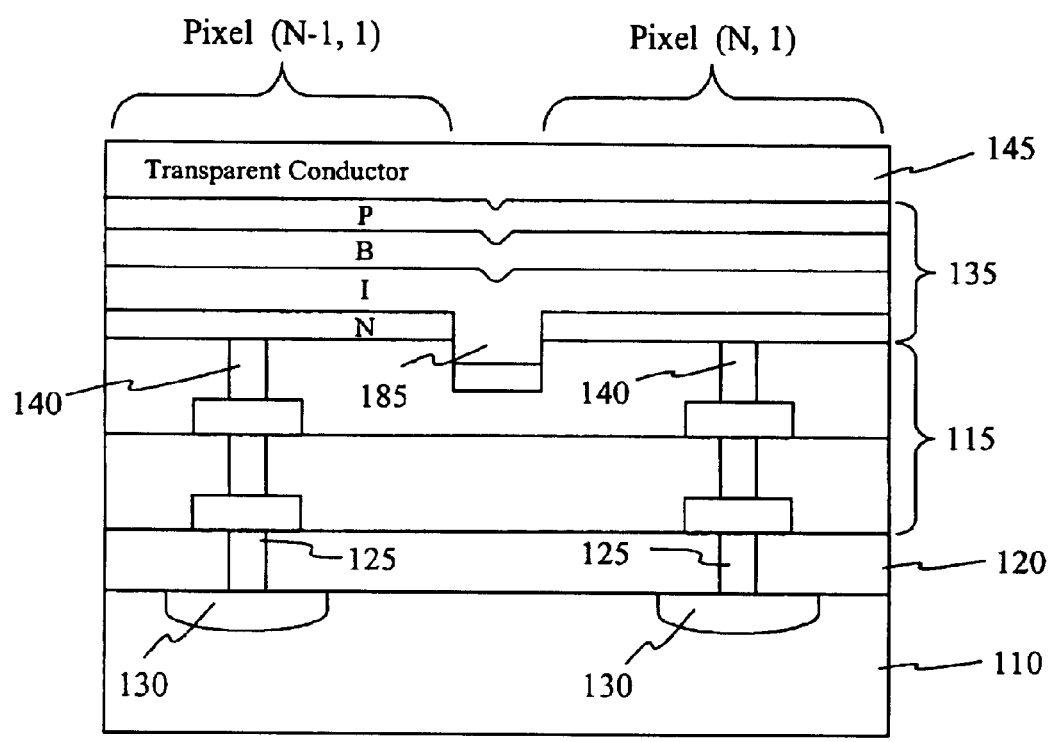
FIG. 6 is a cross-sectional diagram illustrating an alternative embodiment of the POAP sensor of the present invention utilizing a discontinuous photoconductor layer design.

Referring now to FIG. 6, a cross-sectional view of an alternative embodiment of the POAP sensor of the present invention is shown and generally designated 450. Sensor 450 is similar to sensor 100 in many respects, and may include an interlayer dielectric (ILD) layer 120 formed over a substrate 110, and a multi-tiered interconnection structure 135 formed over the interlayer dielectric 120. Sensor 450 may also include a radiation absorbing layer 135 and a transparent conductor layer 145 formed over the multi-tiered interconnection structure 115.

A notable distinction between sensor 100 and sensor 450 relates to the photoconductive layer (e.g. the N-layer in a PBIN diode, or the P-layer in a NIBP diode) that is in electrical communication with the conductive vias 140. In particular, sensor 450 is shown having a discontinuous N-layer created by a trench 185 between adjacent pixel electrodes 140. The trench configuration typically provides a particular degree of electrical isolation between adjacent pixels. However, an increased degree of isolation is possible because the discontinuous bottom layer of the radiation absorbing structure 135 (e.g., N-layer) may comprise a species such as carbon, as previously described. Alternatively or additionally, sensor 450 may be fabricated with metal pads that are in electrical communication with the bottom layer of the radiation absorbing structure 135 and vias 140 (not shown in this Figure).

POAP Sensor Utilizing Trenched Photoconductor Layer

Figure 7:
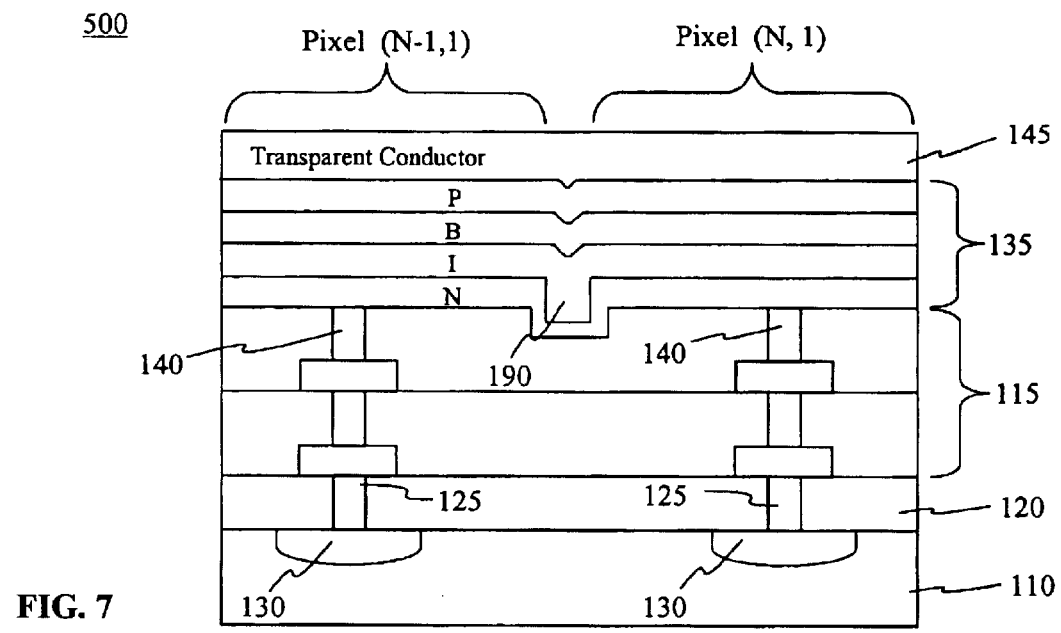
FIG. 7 is a cross-sectional diagram illustrating another alternative embodiment of the POAP sensor of the present invention utilizing a trenched photoconductor layer design.

Referring now to FIG. 7, a cross-sectional view of another alternative embodiment of the POAP sensor of the present invention is shown and generally designated 500. Sensor 500 is similar to the other sensor embodiments in many respects. For example, sensor 500 may include an interlayer dielectric (ILD) layer 120 and a multi-tiered interconnection structure 115 that are each successively formed over the substrate 110. Similarly to the other sensors, sensor 500 may include a radiation absorbing layer 135 and a transparent conductor layer 145 formed over the multi-tiered interconnection structure 115.

Similarly to the trench design utilized in sensor 450, the sensor 500 also comprises a trench between adjacent pixel electrodes 140. However, trench 190 is not as pronounced as trench 185 (sensor 450), and typically provides for a continuous, but disrupted, N-layer.

The trench configuration shown in FIG. 7 typically provides some degree of isolation between pixel cells by increasing the resistance in the N-layer between neighboring pixels. The increased resistance provided solely by trench 190 typically does not provide adequate pixel cell isolation, resulting in pixel crosstalk.

However, the present invention provides for any additional pixel cell isolation that may be desired by introducing a species such as carbon into the bottom layer of the radiation absorbing structure 135, as previously described. Alternatively or additionally, sensor 500 may be fabricated with the aforementioned metal pads.

POAP Sensor Utilizing Patterned Photoconductor Layer

Figure 8:
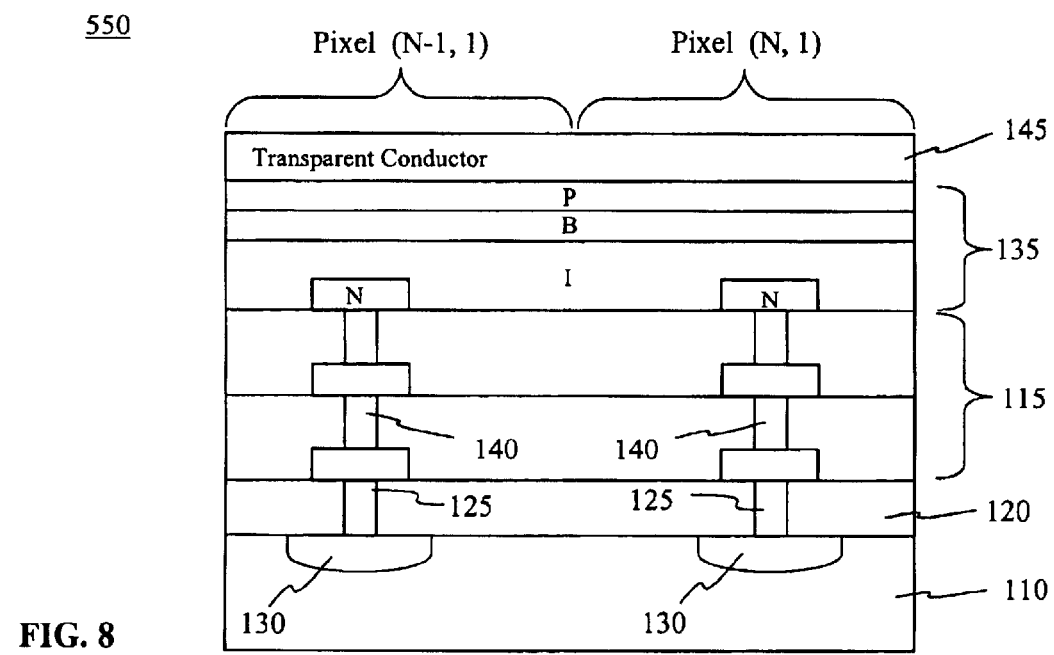
FIG. 8 is a cross-sectional diagram illustrating another alternative embodiment of the POAP sensor of the present invention utilizing a patterned photoconductor layer design.

Referring now to FIG. 8, a cross-sectional view of still another alternative embodiment of the POAP sensor of the present invention is shown and generally designated 550. Sensor 550 is similar to the other sensor embodiments in many respects, such that sensor 550 may include an interlayer dielectric 120 and a multi-tiered interconnection structure 115 formed over the substrate 110. Sensor 550 may also include a radiation absorbing layer 135 and a transparent conductor layer 145 formed over the multi-tiered interconnection structure 115.

In contrast to the other sensors, the sensor 550 comprises a patterned N-layer, in contrast to the trench designs utilized by sensors 450 and 500, and the substantially continuous layered designs utilized by sensors 100 and 300. The patterned configuration shown in FIG. 8 typically provides a degree of electrical isolation between adjacent pixel cells. However, in some applications, the electrical isolation provided solely by the patterning of, for example, the bottom N-layer may not be sufficient. As such, the present invention provides for any additional pixel cell isolation that may be desired by introducing carbon, for example, into the bottom layer of the radiation absorbing structure 135, and/or the utilization of metal pads.

PBIN POAP Sensor Circuitry

It is to be understood that the present invention provides pixel cell isolation by introducing a species, such as carbon atoms or molecules, into the bottom layer of the radiation absorbing structure 135. As a result, an increase in resistivity between adjacent pixel electrodes, within an array of pixel electrodes, may be realized. Alternatively or additionally, a sensor according to the present invention may be fabricated with an array of metal pads to further enhance sensor performance.

Accordingly, the POAP sensor of the present invention may reduce pixel crosstalk between adjacent pixel cells without relying upon any particular pixel cell circuitry design. And that while the present invention may operate with any of a variety of known pixel cell circuitry designs, several non-limiting examples of appropriate pixel cell circuitry designs will be described herein. The described circuitry designs utilize three to six transistors for each of an array of individual pixel cells; and in some instances, may include what will be referred to as a gate bias transistor for maintaining neighboring pixel electrodes at constant (or nearly constant) electrical potential to provide any additional pixel cell isolation that may be desired.

Figure 9:
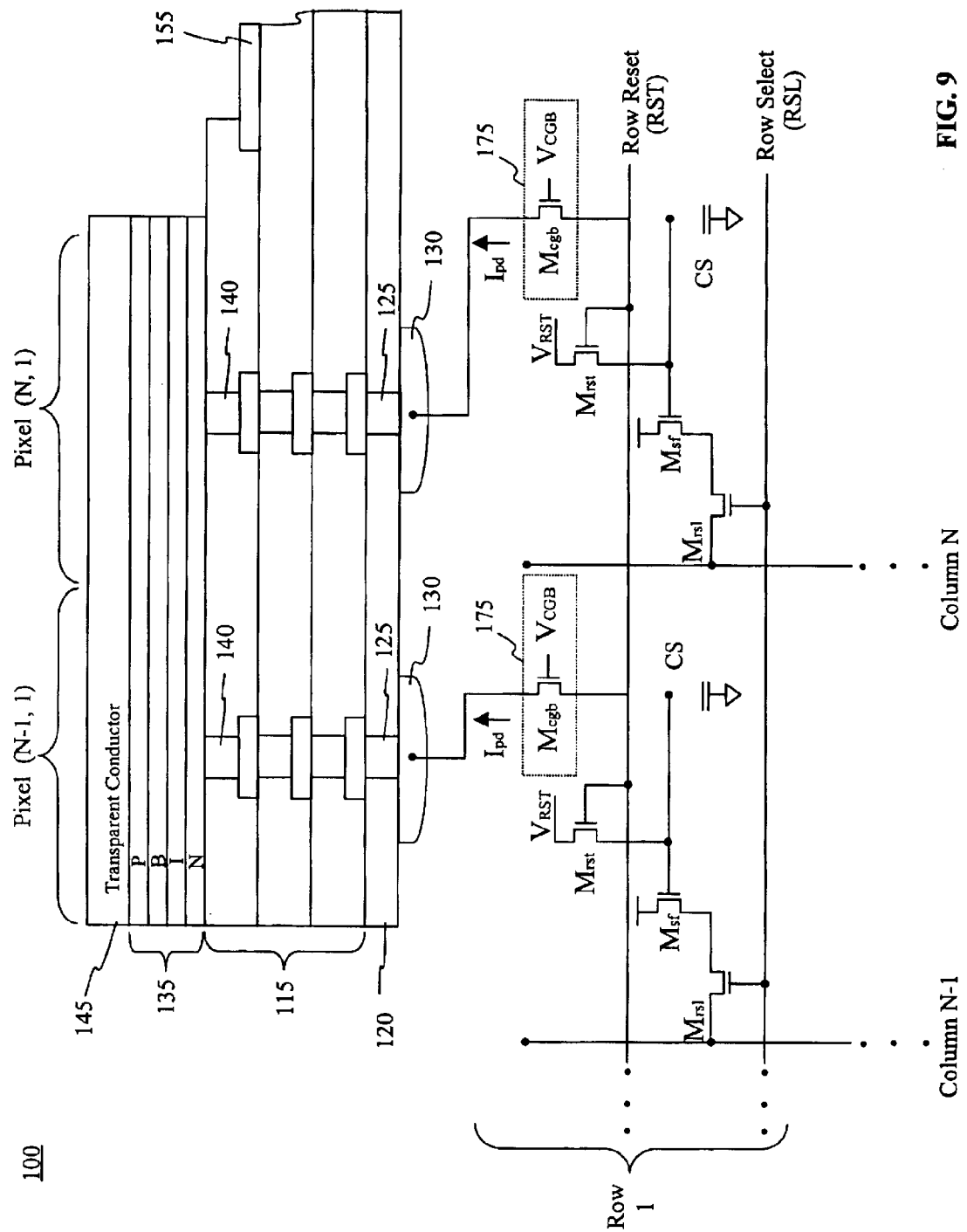
FIG. 9 is a cross-sectional diagram illustrating one embodiment of a PBIN sensor of the present invention, as well as some of the related pixel cell circuitry that may be used to support the PBIN diode architecture.

FIG. 9 is a cross-sectional view of sensor 100 with some of the related pixel cell circuitry. In this Figure, each diffusion region 130 is in electrical communication with respective pixel cell circuitry, which will now be described.

Each of an (N×M) array of pixel cells of the sensor 100 may be configured with a total of four transistors. In particular, each pixel cell may include a conventional configuration of transistors Mrst, Msf, and Mrsl, as well as one additional transistor; namely, a gate bias transistor Mcgb 175. The gate of the transistor Mcgb is shown biased by a constant gate voltage Vcgb. It is to be appreciated, however, that the gate of transistor Mcgb may be biased by a time-varying voltage Vcgb.

Typically, the transistor Mcgb 175 is configured between the diffusion region 130 and the charge sensing node CS. The photocurrent flowing through the source and drain of transistor Mcgb may be used to enable the diffusion region 130 to maintain a constant (or nearly constant) electrical potential, which is lower than the constant gate bias by the threshold voltage of the transistor Mcgb 175. One aspect provided by the transistor Mcgb 175 enables the effective separation of the diffusion region 130 and the charge sensing node CS.

This circuitry configuration typically results in the P-layer having a lower potential than the N-layer for a reverse bias. Further, each of the pixel electrodes 130 typically comprises lower potential than the constant gate bias.

For example, during the charge integration process, the electrical potential of each diffusion region 130 may vary depending on the amount of optical charge collected at each pixel site. This typically occurs because each particular pixel cell array may receive a variable amount of light energy, thereby producing an equally varying electrical potential.

Traditional sensors that utilize three-transistor pixel cell configurations, and do not incorporate a transistor Mcgb 175, may experience electrical potential differentials related to their respective light energies received. As a result, the charge sensing nodes CS of adjacent pixel cells of these traditional sensors may experience potential differences of anywhere from about 100 millivolts to about 1000 millivolts. The existence of such potential differences may result in undesirable pixel crosstalk, for example, and may increase image blurring.

Again, the present invention provides an increase in resistivity between adjacent pixel electrodes, resulting in the substantial elimination of pixel crosstalk. However, if desired, the transistor Mcgb 175 may be utilized in maintaining the diffusion region 130 at a constant (or nearly constant) electrical potential, further enhancing the effective separation of the diffusion region 130 and the charge sensing node CS.

During operation, because of the inclusion of the transistor Mcgb 175, the potential difference for pixel electrodes 130 in adjacent pixel cells may be further reduced. Typically, any remaining potential difference between adjacent pixel cells is caused by the threshold-voltage non-uniformity of the CMOS process, which is typically less than 10 millivolts, RMS, for state-of-art CMOS processes.

It is therefore to be understood that each diffusion region 130, for each an array of pixel cells, may be maintained at equal (or substantially equal) potential. As a result, pixel crosstalk may be further reduced, or even eliminated.

According to one embodiment, the isolation of the charge sensing nodes CS, by the inclusion of the transistor Mcgb 175, may be implemented without the need for the patterning of the bottom N-layer (or a bottom P-layer in a NIBP photodiode configuration). In this embodiment, a continuous PBIN layer deposition process may be utilized in the fabrication of the POAP sensor of the present invention, thereby decreasing fabrication time and expense.

The POAP sensor of the present invention may be fabricated using most any of the commercially available CMOS processes to accommodate any of a variety of pixel cell sizes and geometries. For example, the POAP sensor of the present invention may be fabricated as having a 4 μm by 4 μm pixel cell and a 0.25 m baseline CMOS process, without increasing the pixel cell size.

It is also to be understood that photosensitive devices utilized by the present invention are not competing for space with non-photosensitive devices. As such, the fill factor of the photosensitive device may be substantially increased over existing active pixel sensors. As such, the present invention may provide fill factors of nearly 100 percent.

It is also to be realized that because of process variations of the threshold voltages of Mcgb transistors and/or the gate-to-source voltage variations among the Mcgb transistors (caused by the photocurrent variations among adjacent pixels), the reduction in the potential difference for pixel electrodes 130 in adjacent pixel cells typically will not reach zero.

Individual Pixel Cell Using Gate Bias

Figure 10:
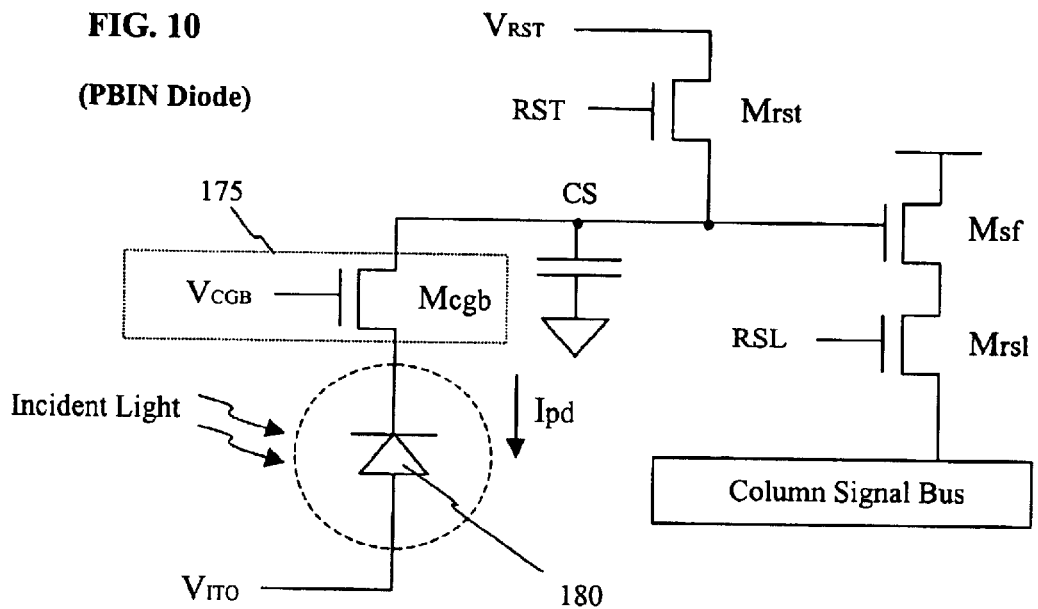
FIG. 10 is a schematic diagram of exemplary circuitry that may be used for an individual pixel cell having a PBIN diode structure.

Referring now to FIG. 10, a schematic diagram of exemplary circuitry that may be used for an individual pixel cell having a PBIN diode structure is shown. Again, it is to be understood that each of an array of pixel cells may be similarly constructed.

Each of the four transistors that may be used in the individual pixel cell circuitry are shown. In particular, the pixel cell is shown having transistors Mrst, Msf, and Mrsl, as well as the gate bias transistor Mcgb 175. The gate of the transistor Mcgb is shown biased by a constant gate voltage Vcgb.

The transistor Mrst acts as reset transistor whose gate is connected to the Row Reset (FIG. 9), and whose source is connected to the transistor Mcgb. A source follower transistor Msf contains a gate that is connected to transistor Mcgb. A select transistor Mrsl contains a gate that is connected to the Row Select (FIG. 9), and whose drain is connected to the source of the source follower transistor Msf.

During the charge integration process, incident light may strike photodiode 180, creating a photocurrent that may be correlated to the optical intensity of the light. The transistor Mcgb 175, which may be biased by a constant gate voltage Vcgb, is shown configured between the photodiode 180 and the charge sensing node CS. Again, the photocurrent flowing through the source and drain of transistor Mcgb may be used to enable the diffusion region 130 (FIG. 9) to maintain a constant (or nearly constant) electrical potential.

As previously described, the present invention may be fabricated as either a PBIN or NIBP diode structure. Accordingly, one of ordinary skill will realize that the individual pixel cell circuitry utilizing a PBIN diode structure shown in FIG. 10 may be modified to accommodate a NIBP diode structure. An example of such a construction is shown in FIG. 11.

Figure 11:
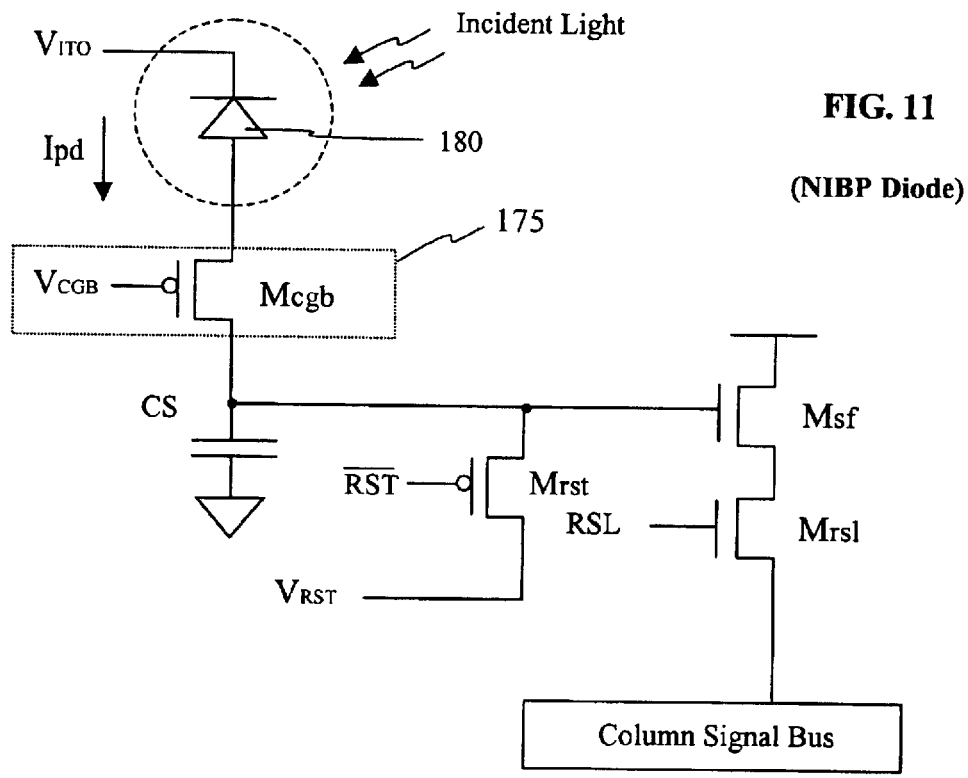
FIG. 11 is a schematic diagram of exemplary circuitry that may be used for an individual pixel cell having a NIBP diode structure.

Referring now to FIG. 11, a schematic diagram of exemplary circuitry that may be used for an individual pixel cell having a NIBP diode structure is shown. The various electrical components shown in this circuit are essentially similar to that shown in the PBIN diode structure of FIG. 10, with modifications made to accommodate a NIBP diode structure.

For example, the photodiode 180 is shown inverted as compared to the configuration in FIG. 10. Also, the gate of the reset transistor Mrst receives an inverted reset signal, denoted by signal $\overline{RST}$.

Figure 12:
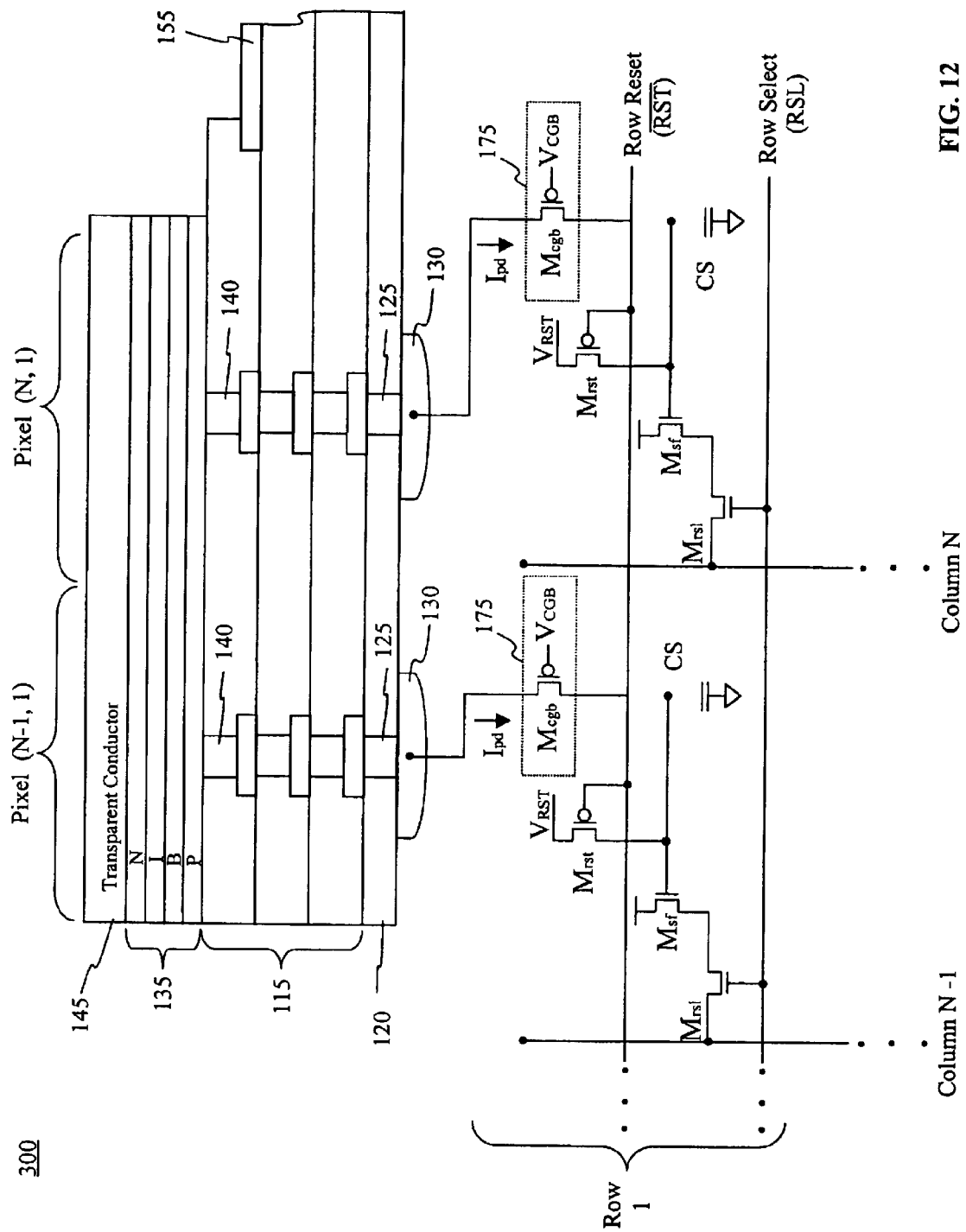
FIG. 12 is a cross-sectional diagram illustrating a NIBP sensor of the present invention, as well as some of the related pixel cell circuitry that may be used to support a NIBP diode architecture.

FIG. 12 is a cross-sectional view of a sensor 300 configured with the four transistor pixel cell circuitry design shown in FIG. 11. For example, each diffusion region 130 is shown in electrical communication with respective pixel cell circuitry that accommodates a NIBP photodiode layered design.

The individual pixel cells utilized in the present invention have been described as utilizing four-transistor pixel cell architecture. Once again, the present invention is not limited to any particular pixel cell circuitry design and alternative architectures are possible and within the contemplation of the present invention. For example, the pixel cell circuitry utilized in the sensor of the present invention may include anywhere from two to six transistors, or even more. By way of illustration, alternative pixel cell architectures that may be used to maintain an equal potential over an array of pixel electrodes will now be described.

Figure 13:
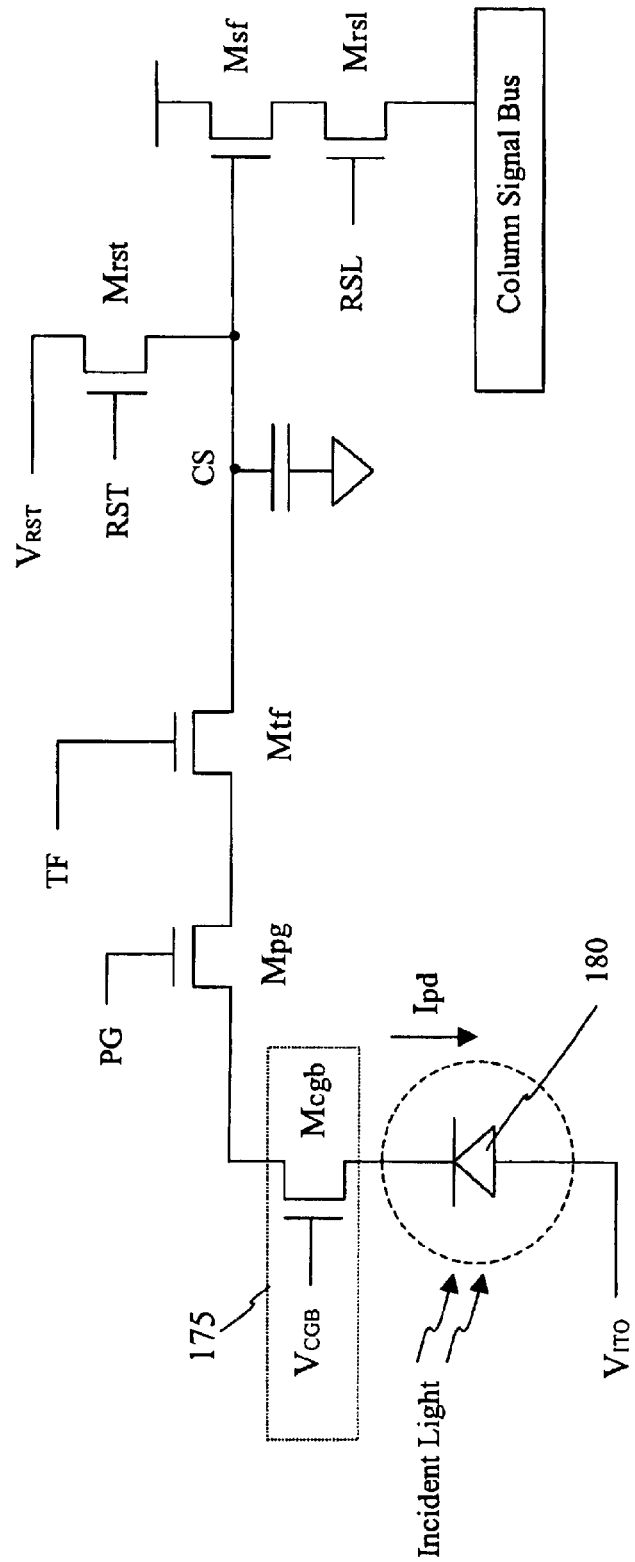
FIG. 13 is a schematic diagram of exemplary circuitry utilizing a six transistor architecture that may be used for an individual pixel cell having a PBIN diode structure.

FIG. 13 is a schematic diagram of exemplary circuitry for a six-transistor pixel cell that may be used for individual pixel cells having a PBIN diode structure. The circuitry shown in FIG. 13 is similar in many respects to that shown in FIG. 10. However, the circuitry in FIG. 13 comprises two additional transistors (i.e., transistors Mpg and Mtf) than that utilized in the FIG. 10 design.

In FIG. 13, the transistor Mcgb is shown biased by a constant gate voltage VCGB, so that each of an array of pixel electrodes PX may be maintained at approximately the same electrical potential. The reset transistor Mrst, the source follower transistor Msf, the row-select transistor Mrsl, as well as the gate bias transistor Mcgb function similarly as in the four-transistor pixel cell described above (FIG. 10).

A fifth transistor Mpg, the photogate transistor, may be used as a MOS capacitor to store the photo-generated charge carriers (e.g., electrons). A sixth transistor Mtf, the transfer transistor, may be used to transfer the stored charge under Mpg to the charge-sensing node CS. One advantage of utilizing a six-transistor pixel cell over a lower number transistor configuration (e.g., the four-transistor pixel cell) is that the six-transistor pixel cell architecture permits a Correlated Double Sampling (CDS) to be performed, typically resulting in a reduction of pixel readout noise.

A common technique used in CMOS sensor readout circuitry to reduce pixel-to-pixel fixed-pattern noise is called double sampling. In this technique, a reset reference voltage for each pixel may be read out and subtracted from the photo signal voltage to cancel the common offset voltages due to device mismatches, which could vary from pixel to pixel. However, each reset operation often introduces a temporal noise, commonly referred to as the KTC noise.

In the four-transistor pixel cell, for example, the charge storage node (the node that stores the photo-generated charge carriers) and the charge-sensing node (the node that converts the charge to voltage output) are typically the same node. As such, the reset reference voltage at the charge-sensing node of each pixel cell can only be read out after the photo signal voltage is read out (otherwise the stored photo charge will be wiped out); therefore, the reset reference voltage is not correlated with the photo signal voltage.

Hence, the KTC noise associated with the signal voltage cannot be cancelled in the four-transistor design. The double sampling performed this way is commonly referred to as an uncorrelated double sampling. Although uncorrelated double sampling may reduce the pixel-to-pixel fixed-pattern noise, it typically can not reduce KTC noise, and in many situations, it increases the KTC noise.

On the other hand, in the case of a six-transistor pixel cell, the transfer transistor Mtf effectively separates the charge storage node (the MOS capacitor under the gate of Mpg) from the charge-sensing node. During the process of charge integration, the photogate transistor Mpg may be biased in the deep depletion mode (VPG=VDD, in the case of NMOS) and the transfer transistor is turned off. At the end of the charge integration, a reset pulse may reset the charge-sensing node. The reset reference voltage at the charge-sensing node may then be read out first.

Next, the transfer transistor may be turned on and the gate voltage of Mpg pulsed into an accumulation mode (VPG=0, in the case of NMOS) to dump the stored photo charges onto the charge-sensing node so that the photo signal voltage can be read out accordingly. Because the reset reference voltage contains the same KTC noise as in the photo signal voltage, an external subtraction of the reset reference voltage from the photo signal voltage will typically eliminate the KTC noise completely. This operation is referred to as the Correlated Double Sampling.

The six-transistor pixel cell configuration typically requires a larger pixel cell area as compared to the four-transistor pixel cell because of the two additional transistors. However, the six-transistor pixel cell configuration is particularly useful in applications where the reduction of pixel-to-pixel fixed-pattern noise while being substantially free of KTC noise is desired, even though a larger pixel cell may be required.

Figure 14:
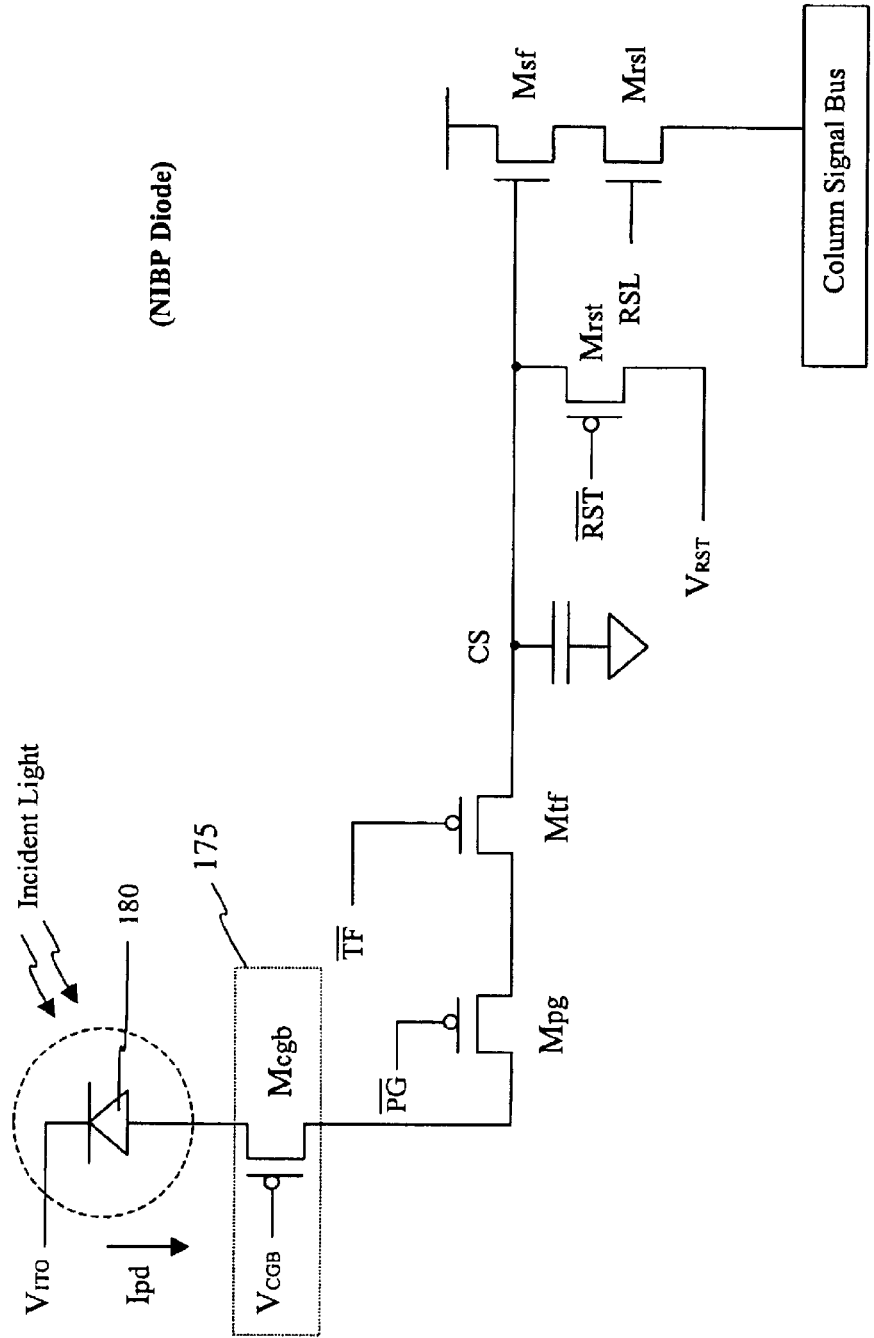
FIG. 14 is a schematic diagram of exemplary circuitry utilizing a six transistor architecture that may be used for an individual pixel cell having a NIBP diode structure.

FIG. 14 is a schematic diagram of exemplary circuitry for a six-transistor pixel cell that may be used for individual pixel cells having a NIBP diode structure. The various electrical components shown in this circuit are essentially similar to that shown in the PBIN diode structure of FIG. 13, with modifications made to accommodate a NIBP diode structure.

For example, FIG. 13 shows a six-transistor pixel cell that can be used with a PBIN POAP sensor structure where electrons are collected, stored, and converted to readout voltages. In contrast, FIG. 14 shows a six-transistor pixel cell that can be used with a NIBP POAP sensor structure where holes are collected, stored, and converted to readout voltages. Furthermore, the six-transistor pixel cell shown in FIG. 14 comprises inverted PG, TF, and RST signals, in contrast to non-inverted PG, TF, and RST signals utilized in the PBIN diode architecture shown in FIG. 13.

Individual Pixel Cell Without Gate Bias

FIG. 15 is a schematic diagram of exemplary circuitry for a three-transistor pixel cell that may be used for individual pixel cells having a PBIN diode structure. The circuitry shown in FIG. 15 is similar in many respects to that shown in FIG. 13, with the notable distinction that the FIG. 15 design does not include the constant gate bias transistor, Mcgb. As such, the PBIN diode pixel circuitry design shown in FIG. 15 typically does not maintain the adjacent pixel electrodes at equal potential. Similarly, FIG. 16 is a schematic diagram of exemplary circuitry for a three-transistor pixel cell that may be used for individual pixel cells having a NIBP diode structure. The circuitry shown in FIG. 16 is similar in many respects to that shown in FIG. 14, with the notable distinction that the FIG. 16 design does not include the constant gate bias transistor, Mcgb. As such, the NIBP diode pixel circuitry design shown in FIG. 16 also does not typically maintain the adjacent pixel electrodes at equal potential.

Figure 17:
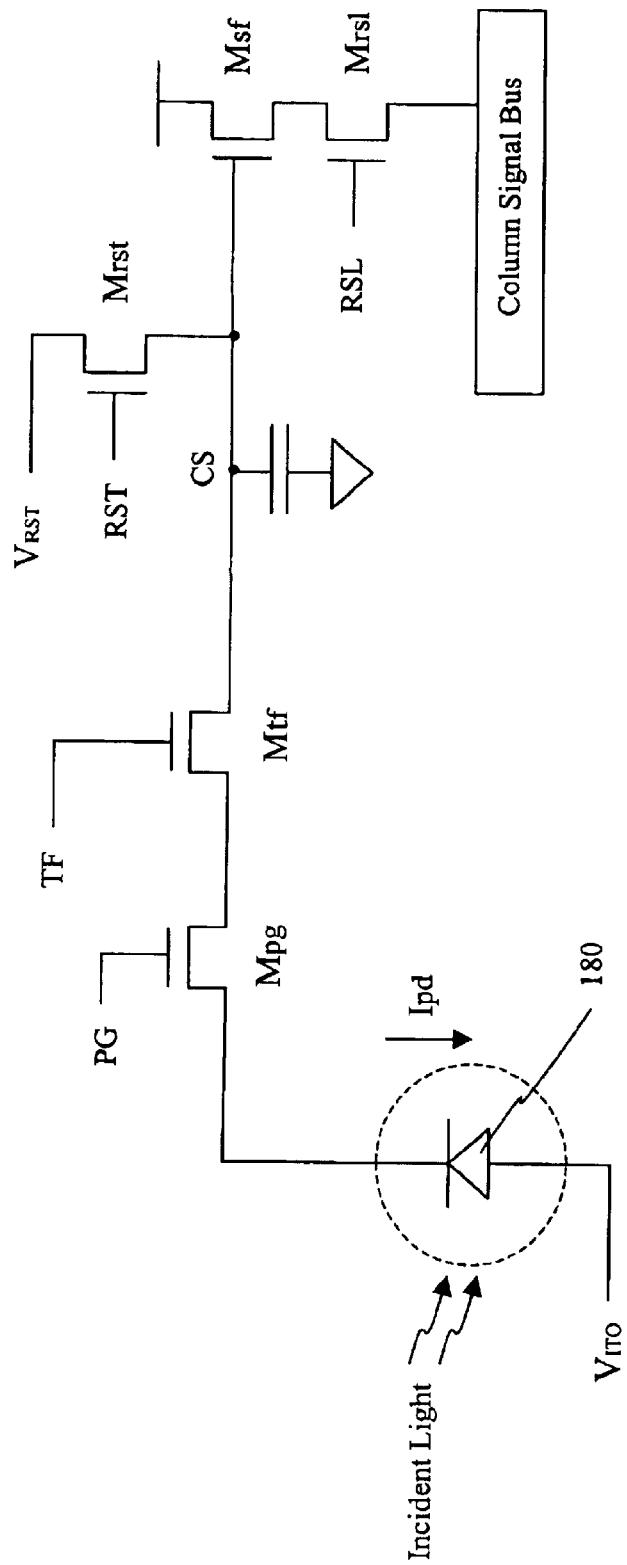
FIG. 17 is a schematic diagram of exemplary circuitry utilizing a five-transistor architecture that may be used for an individual pixel cell having a PBIN diode structure.
Figure 18:
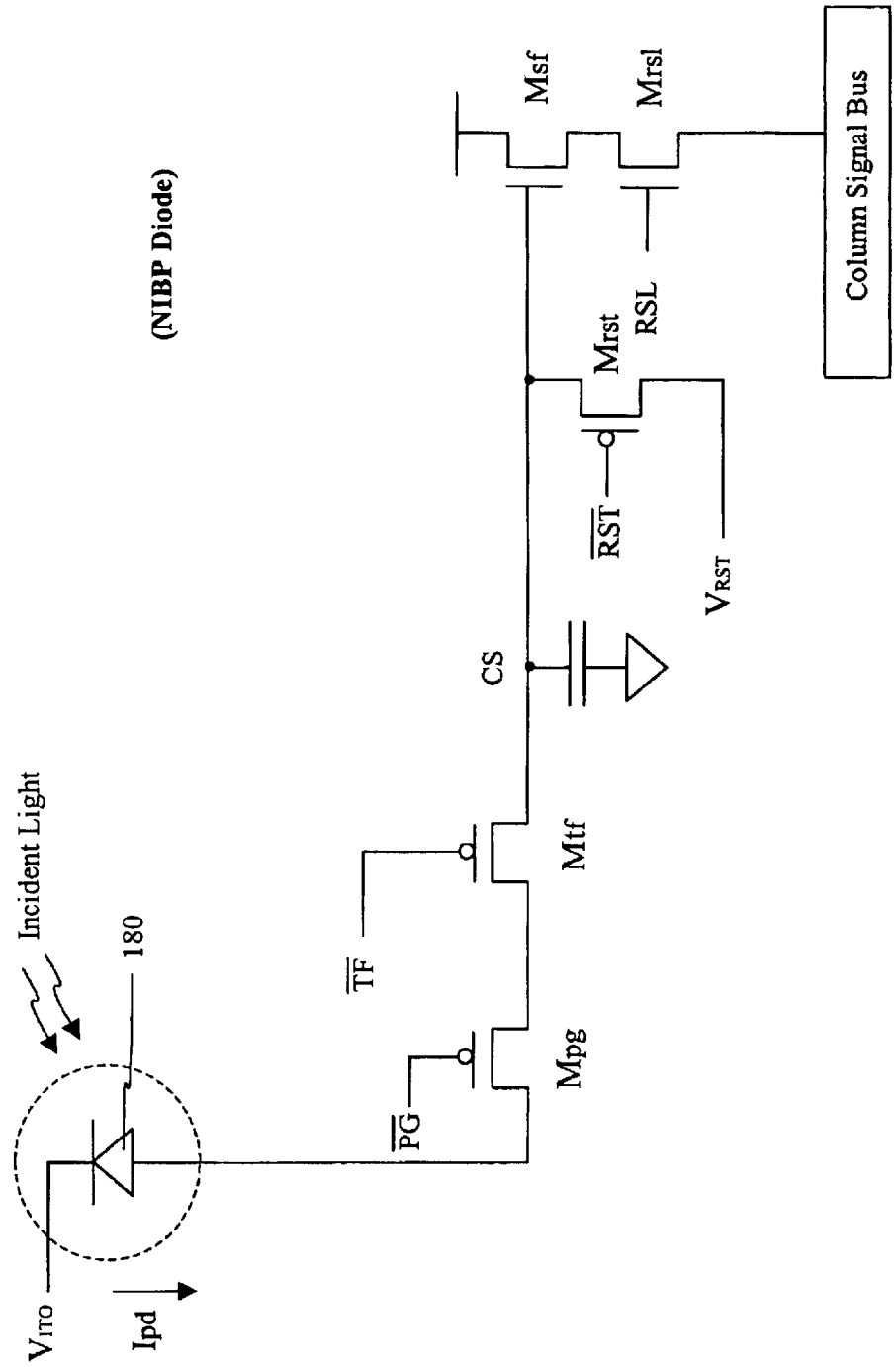
FIG. 18 is a schematic diagram of exemplary circuitry utilizing a five-transistor architecture that may be used for an individual pixel cell having a NIBP diode structure.

FIGS. 17 and 18 are schematic diagrams of exemplary circuitry that may be utilized in a five-transistor pixel cell having a PBIN and NIBP diode structures, respectively. The circuitry shown in FIGS. 17 and 18 are similar in many respects to that shown in FIGS. 10 and 11, respectively. The primary difference between these circuitry designs relate to the elimination of the constant gate bias transistor, Mcgb, in FIGS. 17 and 18. As such, the PBIN and NIBP pixel circuitry designs respectively shown in FIGS. 17 and 18 typically do not maintain the adjacent pixel electrodes at equal potential. Accordingly, one of ordinary skill will realize that that POAP sensors according to the present invention may be fabricated using any of a variety of different circuitry designs.

POAP Sensor Fabrication

Figure 19:
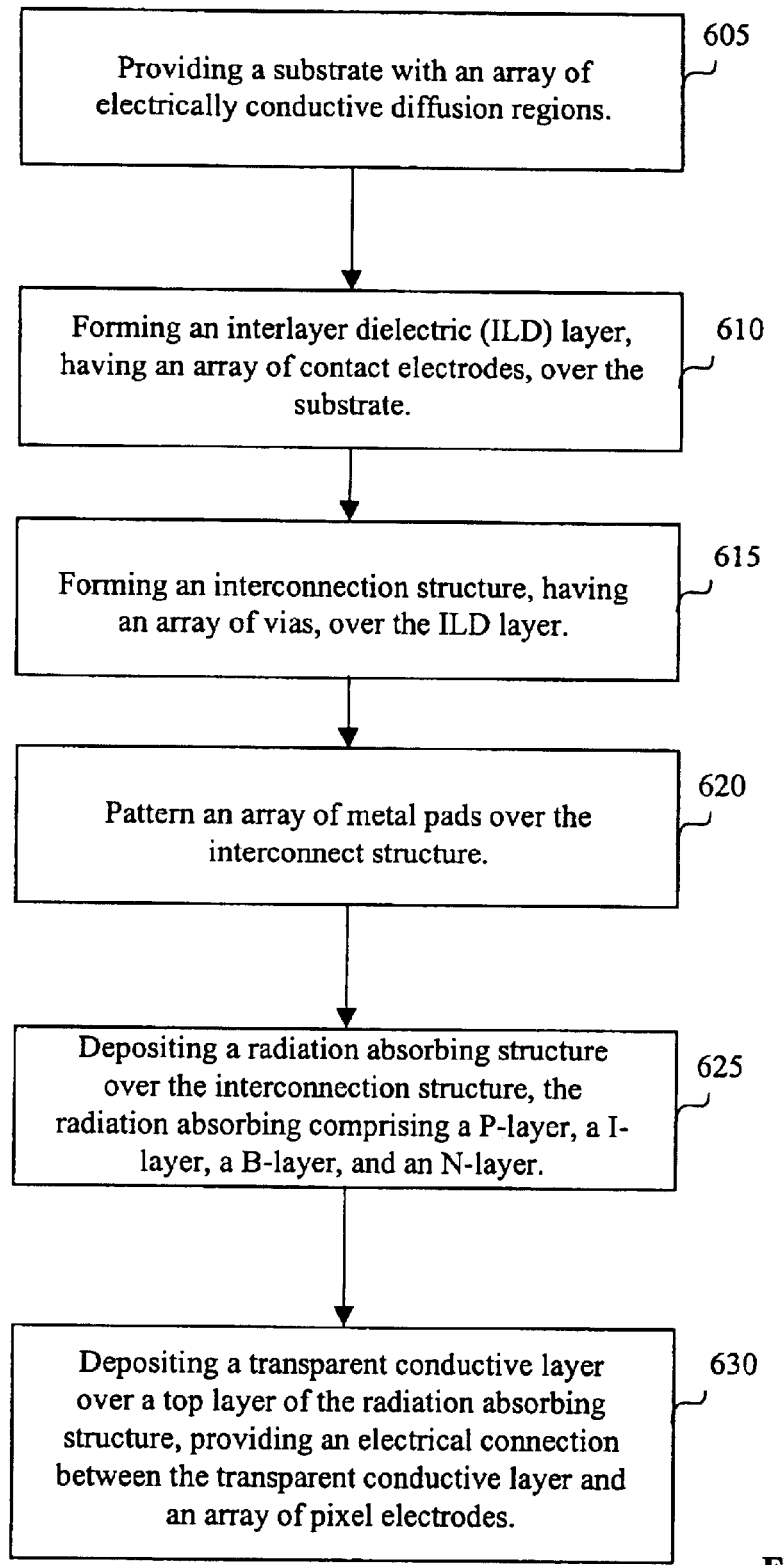
FIG. 19 is a flowchart showing exemplary operations that may be used to fabric a POAP sensor according to one embodiment of the present invention.

FIG. 19 is a flowchart showing exemplary operations that may be used to fabric a POAP sensor. The formation of a POAP sensor according to one embodiment of the present invention will now be described with reference made to the operations shown in FIG. 19, as well as the sensor fabrication stages shown in FIGS. 20A–F.

Figure 20A:
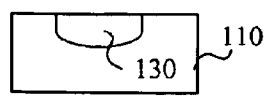
FIGS. 20A–F are partial cross-sectional diagrams showing fabrication steps that may be utilized in fabricating a POAP sensor according to one embodiment of the present invention.
Figure 20B:
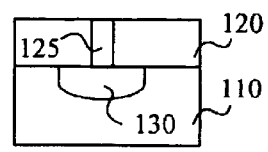

In FIG. 19, a first operation 605 includes providing a substrate 110 with an array of electrically conductive diffusion regions 130 (FIG. 20A). Next, in operation 610, an interlayer dielectric (ILD) layer 120 may be formed with an array of contacts 125 that are each associated with one of the array of diffusion regions 130 (FIG. 20B).

Figure 20C:
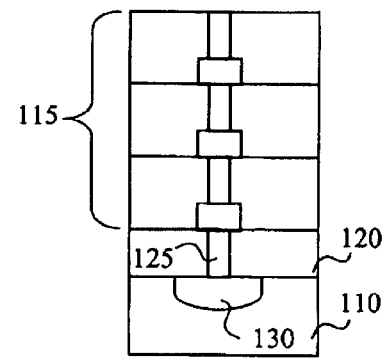

In operation 615, a multi-tiered interconnection structure 115 may be formed over the ILD layer 120 (FIG. 20C). The conductive via 140 within the multi-tiered interconnection structure 115 may be formed from an appropriate electrically conductive material, such as tungsten, copper, aluminum, or other similar materials. Typically, the conductive via 140 is formed during a CVD process, but other processes may be used.

Figure 20D:
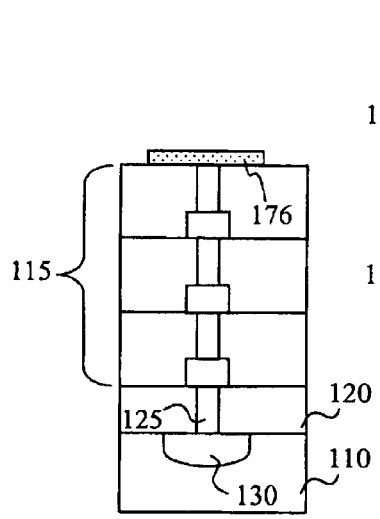

In optional operation 620, a metal pad 176 may be patterned adjacent the interconnection structure 115, enabling an electrical connection between the via 140 and the metal pad 176 (FIG. 20D).

Figure 20E:
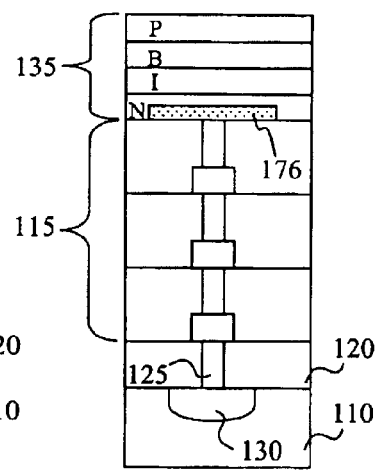

In the next operation 625, separate PBIN layers are each successively deposited over the interconnection structure 115 to form the radiation absorbing structure 135 (FIG. 20E). Alternatively, in situations where a NIBP diode structure is desired (e.g., sensor 300 shown in FIG. 5A), separate NIBP photodiode layers may each be successively deposited over the interconnection structure 115 to form the radiation absorbing structure 135 (not shown).

Typically, the deposition of the various layers of the radiation absorbing structure 135 is accomplished during a PECVD process. Again, it is to be understood that according to one embodiment, the radiation absorbing structure 135 may be formed during a continuous deposition processes because it is not necessary to pattern one or more of these layers (e.g., a bottom N-layer in a PBIN diode structure).

Figure 20F:
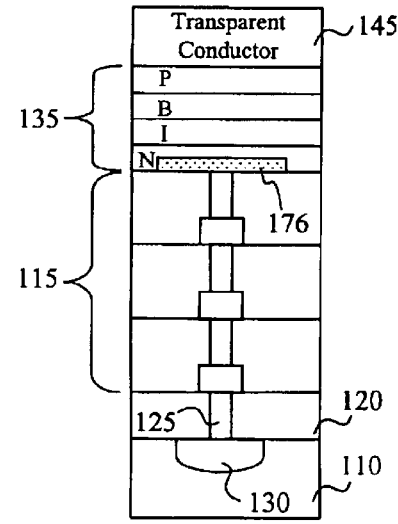

In operation 630, a transparent conductor layer 145 may be deposited over the top layer of the radiation absorbing structure 135 (FIG. 20F). The transparent conductor layer 145 provides an electrical connection between the top layer of the radiation absorbing structure 135 (e.g., a P-layer in a PBIN diode structure, or an N-layer in a NIBP diode structure) and the diffusion region 130.

The transparent conductor layer 145 may be deposited through reactive sputtering. Alternatively, the transparent conductor layer 145 may be grown by evaporation. However, if the transparent conductor layer 145 is formed from titanium nitride, then a CVD process or sputtering process is typically utilized to deposit the transparent conductive layer 145.

An appropriately configured sensor unit utilizing the POAP sensor architecture may be utilized in a variety of applications, including cameras, machine vision systems, vehicle navigation systems, video telephones, computer input devices, surveillance systems, auto focus systems, star trackers, motion detection systems, image stabilization systems, scanners, and other similar devices. Those who may also benefit from the use of such devices include law enforcement, medical, fire departments, emergency service and search and rescue operations, as well as the military and intelligence communities.

Additional uses may include non-destructive testing, preventative maintenance operations, commercial security applications, as well as the automotive industry for providing, for example, a driver with low light level viewing enhancement devices.

While there have been shown what are presently considered to be preferred embodiments of the present invention, it will be apparent to those skilled in the art that various changes and modifications can be made herein without departing from the scope and spirit of the invention.

What is claimed is:

1. An active pixel sensor for producing images from electron-hole producing radiation comprising:
    a crystalline semiconductor substrate having an array of electrically conductive diffusion regions;
    an interlayer dielectric (ILD) layer formed over said crystalline semiconductor substrate and comprising an array of contact electrodes;
    an interconnect structure formed over said ILD layer, wherein said interconnect structure includes at least one layer comprising an array of conductive vias;
    an array of patterned metal pads formed over said interconnect structure;
    an array of charge collecting pixel electrodes defined by said array of diffusion regions, said array of contact electrodes, said array of conductive vias, and said array of patterned metal pads;
    a radiation absorbing structure comprising N-I-B-P photodiode layers formed over said interconnect structure and said array of patterned metal pads, wherein said N-I-B-P photodiode layers are photoconductive on exposure to electron-hole producing radiation;
    a surface lectrode layer comprising electrically conductive material and formed over said radiation absorbing layer, wherein said surface electrod layer is at least partially transparent to said electron-hole producing radiation, and connected to a voltage source for establishing an electrical field across said radiation absorbing structure and between said surface electrode layer and each of said array of charge collecting pixel electrodes, wherein said P-layer is electrically connected to said array of charge collecting pixel electrodes, and said N-layer is electrically connected to said surface electrode layer; and
    an array measurement circuit for measuring charges collected by each of said array of charge collecting pixel electrodes, and for outputting pixel data indicative of said collected charges, wherein said pixel data comprises information defining an image.

2. The sensor according to claim 1, wherein said P-layer and said B-layer comprise Silicon (Si) and Carbon (C).

3. The sensor according to claim 1, wherein said P-layer and said B-layer comprise Silicon (Si) end Carbon (C), and wherein said P-layer and said B-layer have different relative C to Si ratios.

4. The sensor according to claim 1, wherein said interconnect structure comprises a plurality of layers, wherein each of said plurality of layers comprises an array of conductive vias, further defining said array of charge collecting pixel electrodes.

5. The sensor according to claim 1, wherein said P-layer comprises p-type doped hydrogenated amorphous silicon.

6. The sensor according to claim 1, wherein said N-layer comprises n-type doped hydrogenated amorphous silicon.

7. The sensor according to claim 1, wherein said N-layer comprises un-intentionally doped hydrogenated amorphous silicon.

8. The sensor according to claim 1, wherein said B-layer comprises hydrogenated amorphous silicon with carbon atoms or molecules.

9. The sensor of claim 8, wherein the B-layer is doped with p-typed impurities.

10. The sensor of claim 9, wherein the doping concentration decreases gradually from the level of P-layer to the level of the I layer.

11. The sensor of claim 8, wherein the B-layer is unintentionally doped.

12. The sensor according to claim 1, wherein said radiation absorbing structure comprises continuous N-I-B-P photodiode layers.

13. The sensor according to claim 1, wherein said radiation absorbing structure comprises at least one discontinuous layer.

14. The sensor of claim 13, wherein said discontinuous layer is the layer making contact to the charge collection electrode.

15. The sensor according to claim 1, wherein said radiation absorbing structure comprises at least one patterned layer.

16. The sensor according to claim 1, wherein said radiation absorbing structure comprises at least one trenched layer.

17. The sensor according to claim 1, wherein said radiation absorbing structure is substantially planar.

18. The sensor according to claim 1, wherein said radiation absorbing structure comprises continuous N-I-B-P photodiode layers that are fabricated during a continuous deposition process.

19. The sensor according to claim 1, wherein said surface electrode layer comprises indium tin oxide.

20. The sensor according to claim 1, wherein said surface electrode layer comprises tin oxide.

21. An active pixel sensor for detecting electron-hole producing radiation comprising:
    a substrate having an array of electrically conductive diffusion regions;
    an interlayer dielectric (ILD) layer formed over said substrate and comprising an array of contact electrodes;
    an interconnect structure having at least one layer formed over said ILD layer, wherein each of said at least one layer comprises an array of conductive vias;
    an array of patterned metal pads formed over said interconnect structure;
    an array of charge collecting pixel electrodes defined by said array of diffusion regions, said array of contact electrodes, said array of conductive vias, and said array of patterned metal pads;

a radiation absorbing structure comprising photoconductive N-I-B-P photodiode layers formed over said interconnect structure and said array of patterned metal pads;

a transparent surface electrode layer formed over said radiation absorbing layer and connected to a voltage source for establishing an electrical field across said radiation absorbing structure, and between said surface electrode layer and each of said array of charge collecting pixel electrodes; and an array measurement circuit for measuring charges collected by each of said array of charge collecting pixel electrodes.

22. An active pixel sensor for detecting electron-hole producing radiation comprising:

a substrate having an array of electrically conductive diffusion regions;

an array of patterned metal pads formed over said substrate;

an array of charge collecting pixel electrodes defined by said array of diffusion regions and said array of patterned metal pads;

a radiation absorbing structure comprising photoconductive N-I-B-P photodiode layers formed over said interconnect structure and said patterned metal pads;

a transparent surface electrode layer formed over said radiation absorbing layer and connected to a voltage source for establishing an electrical field across said radiation absorbing structure, and between said surface electrode layer and said array of charge collecting pixel electrodes; and an array measurement circuit for measuring charges collected by each of said array of charge collecting pixel electrodes.

23. An active pixel sensor for detecting electron-hole producing radiation comprising:

a substrate having an array of electrically conductive diffusion regions;

an interlayer dielectric (ILD) layer formed over said substrate and comprising an array of contact electrodes;

an interconnect structure having at least one layer formed over said ILD layer, wherein each of said at least one layer comprises an array of conductive vias;

an array of charge collecting pixel electrodes defined by said array of diffusion regions, said array of contact electrodes, and said array of conductive vias;

a radiation absorbing structure comprising photoconductive N-I-B-P photodiode layers formed over said interconnect structure, wherein a bottom layer of said N-I-B-P photodiode layers is in electrical contact with said array of charge collecting pixel electrodes and comprises Carbon (C) atoms or molecules to increase resistivity between adjacent pixel electrodes within said array of pixel electrodes;

a transparent surface electrode layer formed over said radiation absorbing layer end connected to a voltage source for establishing an electrical field across said radiation absorbing structure, and between said surface electrode layer and said array of charge collecting pixel electrodes, wherein said P-layer defines said bottom layer and is electrically connected to said array of charge collecting pixel electrodes, and said N-layer is electrically connected to said surface electrode layer; and an array measurement circuit for measuring charges collected by said array of charge collecting pixel electrodes.

* * * * *